United States Patent
Chen et al.

(10) Patent No.: US 12,136,600 B2
(45) Date of Patent: Nov. 5, 2024

(54) GROUNDED METAL RING STRUCTURE FOR THROUGH-SILICON VIA

(71) Applicant: Taiwan Semiconductor Manufacturing Co., Ltd., Hsinchu (TW)

(72) Inventors: Shih-Chang Chen, Hsinchu (TW); Kun-Hsiang Lin, Hsinchu (TW); Cheng-Chien Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 354 days.

(21) Appl. No.: 17/468,886

(22) Filed: Sep. 8, 2021

(65) Prior Publication Data

US 2022/0328429 A1 Oct. 13, 2022

Related U.S. Application Data

(60) Provisional application No. 63/172,420, filed on Apr. 8, 2021.

(51) Int. Cl.
| | | |
|---|---|---|
| *H01L 23/58* | (2006.01) | |
| *H01L 21/768* | (2006.01) | |
| *H01L 23/48* | (2006.01) | |
| *H01L 23/528* | (2006.01) | |

(52) U.S. Cl.
CPC ...... *H01L 23/585* (2013.01); *H01L 21/76898* (2013.01); *H01L 23/481* (2013.01); *H01L 23/5286* (2013.01)

(58) Field of Classification Search
CPC .. H01L 23/585; H01L 23/481; H01L 23/5286
See application file for complete search history.

(56) References Cited

U.S. PATENT DOCUMENTS

| | | | |
|---|---|---|---|
| 8,053,902 B2 * | 11/2011 | Chen | H01L 23/481 |
| | | | 257/776 |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |

(Continued)

*Primary Examiner* — Peniel M Gumedzoe
(74) *Attorney, Agent, or Firm* — Sterne, Kessler, Goldstein & Fox P.L.L.C.

(57) ABSTRACT

The present disclosure describes a semiconductor structure including a TSV in contact with a substrate and a metal ring structure laterally surrounding the TSV. The metal ring structure includes one or more metal rings arranged as a stack and one or more metal vias interposed between two adjacent metal rings of the one or more metal rings. The metal ring structure is electrically coupled to the substrate through one or more conductive structures.

20 Claims, 17 Drawing Sheets

(56) References Cited

U.S. PATENT DOCUMENTS

| | | |
|---|---|---|
| 9,608,116 B2 | 3/2017 | Ching et al. |
| 9,831,183 B2 | 11/2017 | Lin et al. |
| 9,859,386 B2 | 1/2018 | Ho et al. |
| 2009/0134500 A1* | 5/2009 | Kuo ........................ H01L 23/66 |
| | | 257/659 |
| 2011/0031626 A1* | 2/2011 | Park .................. H01L 23/53223 |
| | | 257/E21.585 |
| 2011/0291279 A1* | 12/2011 | McGahay ............. H01L 23/564 |
| | | 257/E21.585 |
| 2014/0035146 A1* | 2/2014 | Kim ..................... H01L 23/485 |
| | | 257/773 |

\* cited by examiner

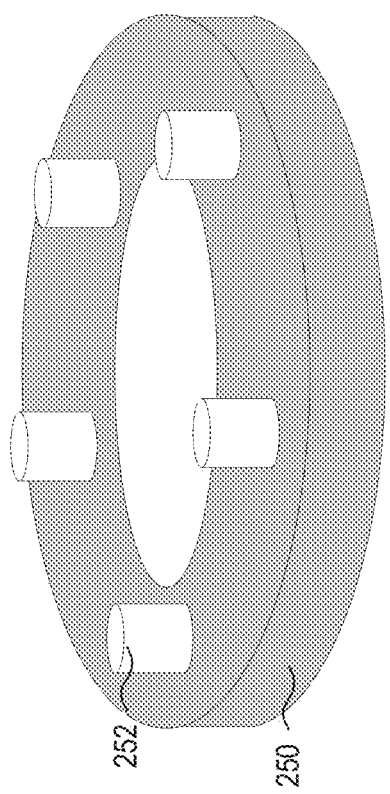
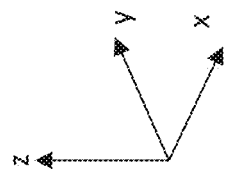
FIG. 2B
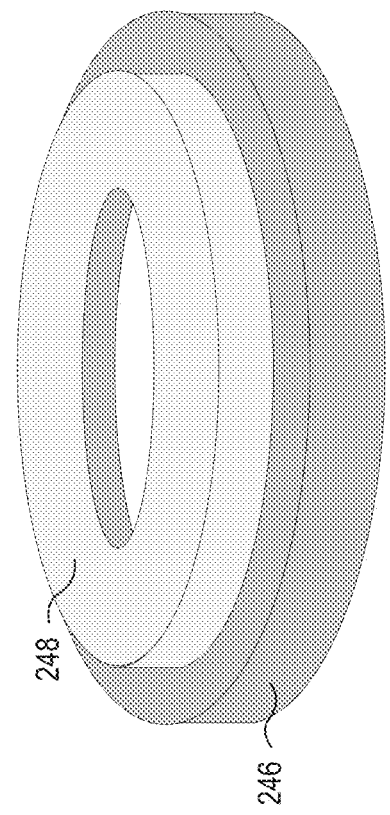
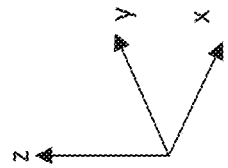
FIG. 2A

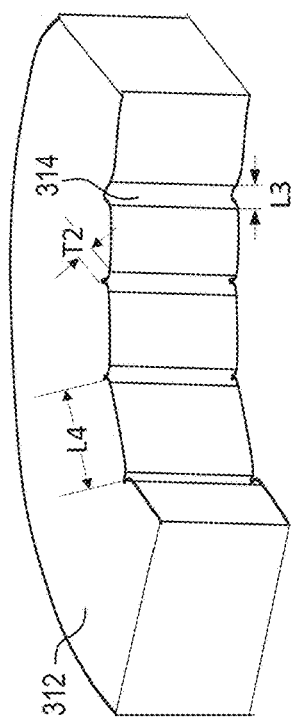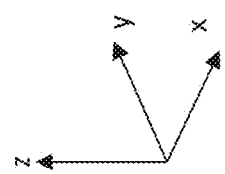
FIG. 3B
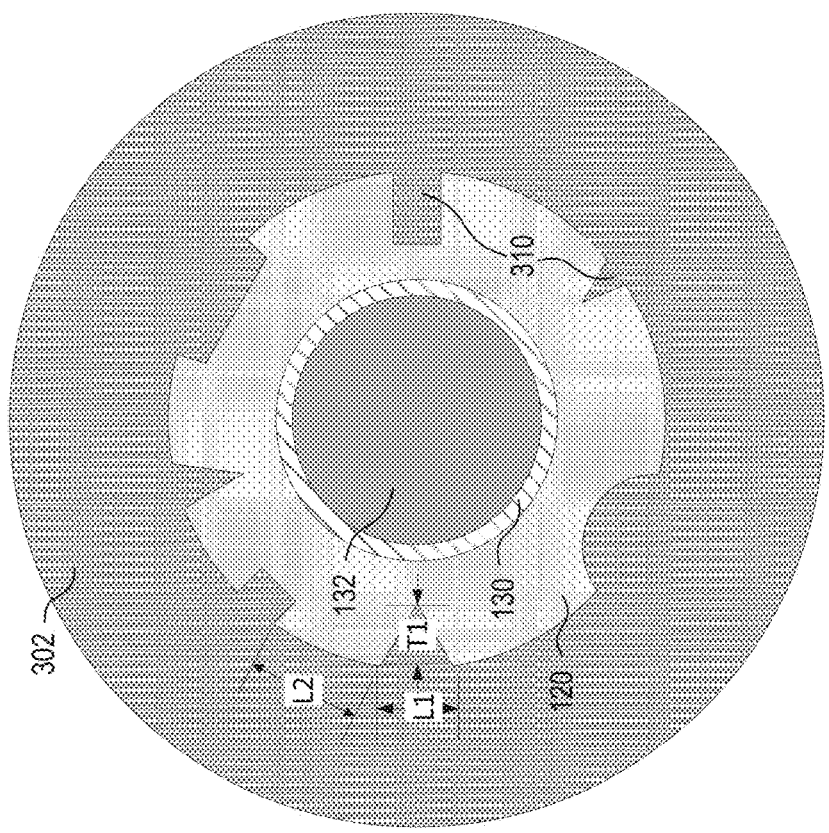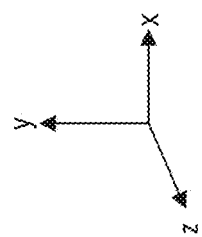
FIG. 3A

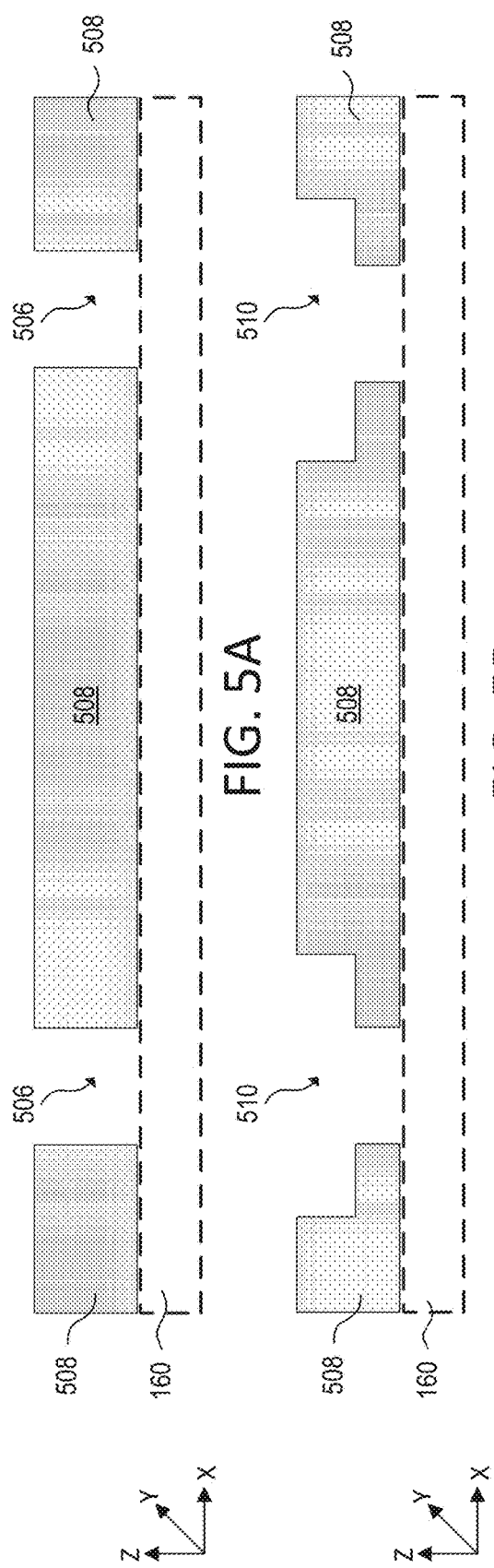
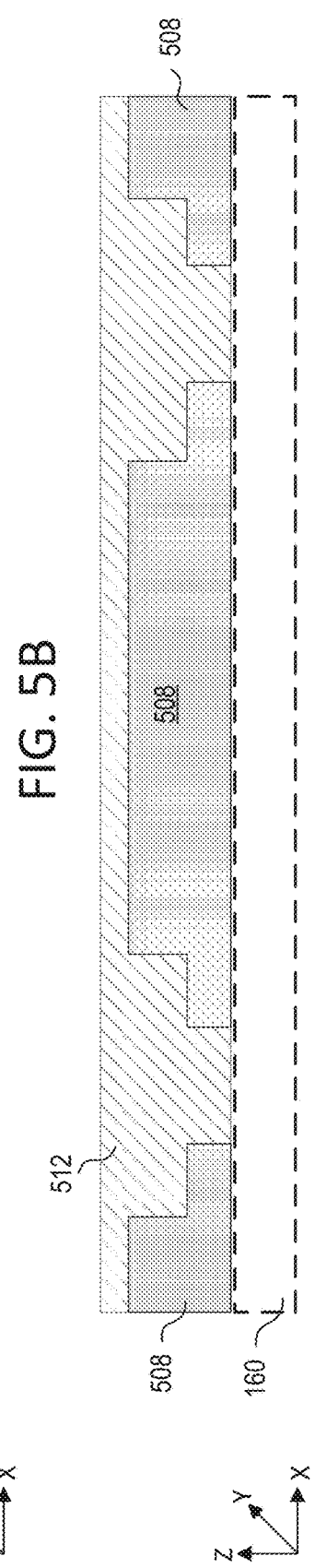
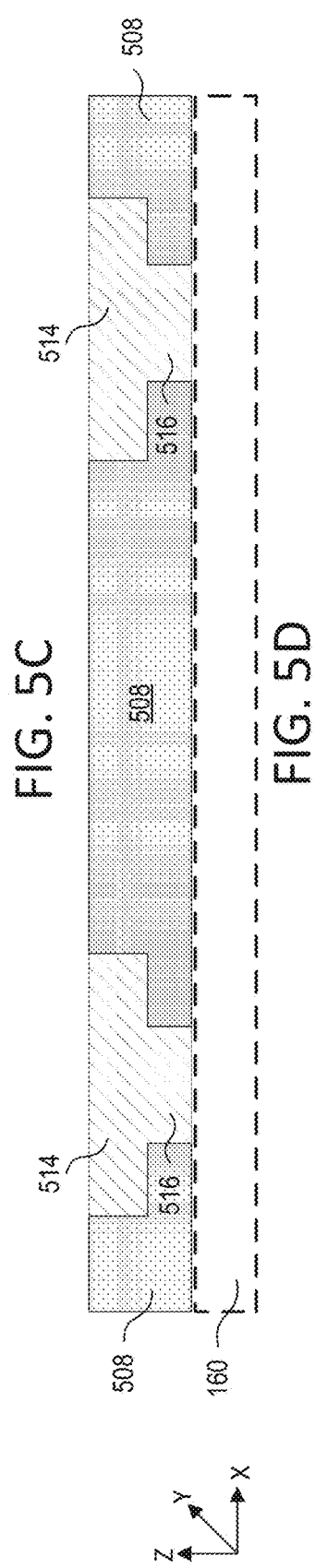
FIG. 5A  FIG. 5B  FIG. 5C  FIG. 5D

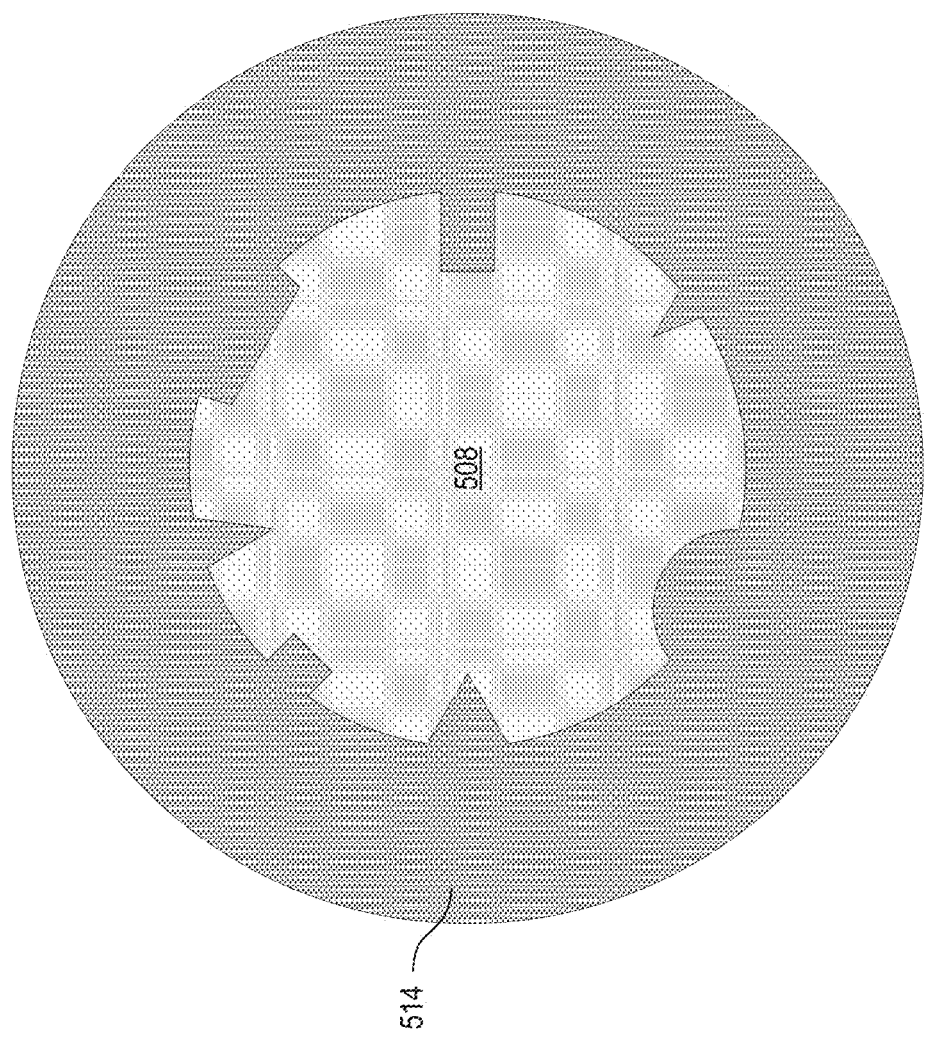
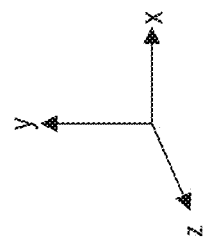
FIG. 5E

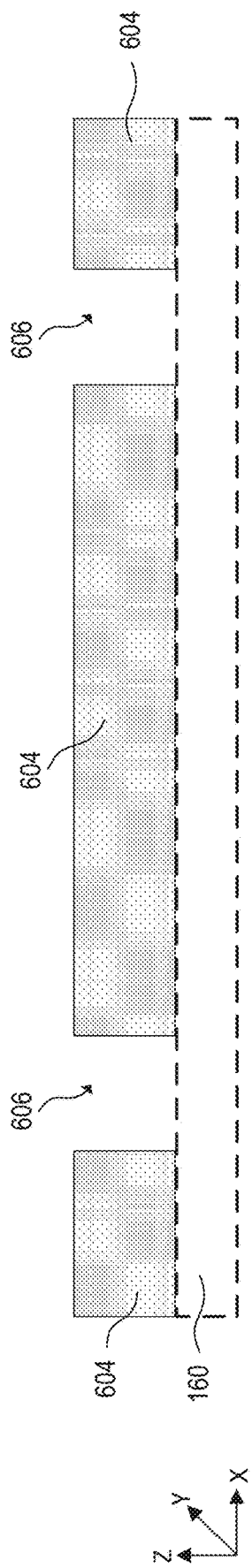
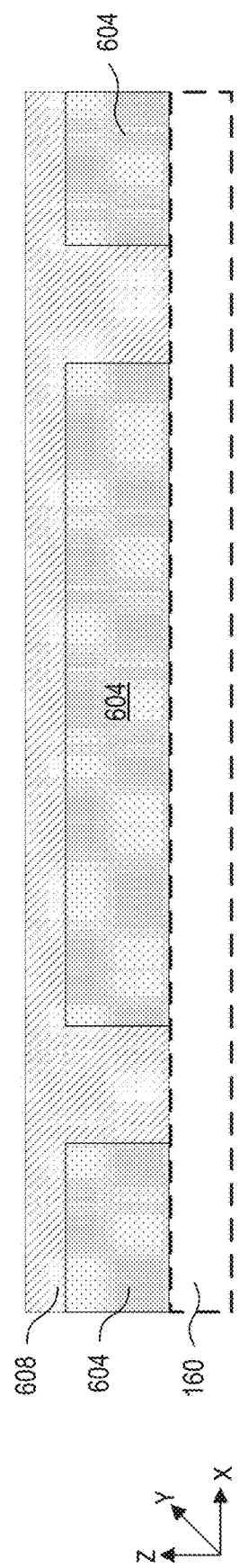
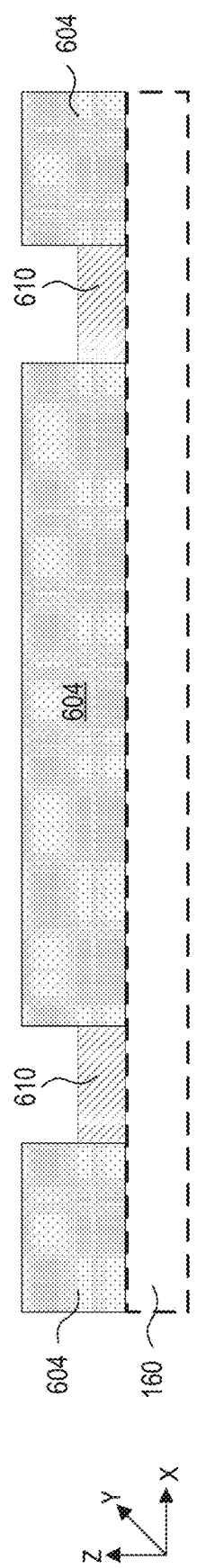
FIG. 6A
FIG. 6B
FIG. 6C

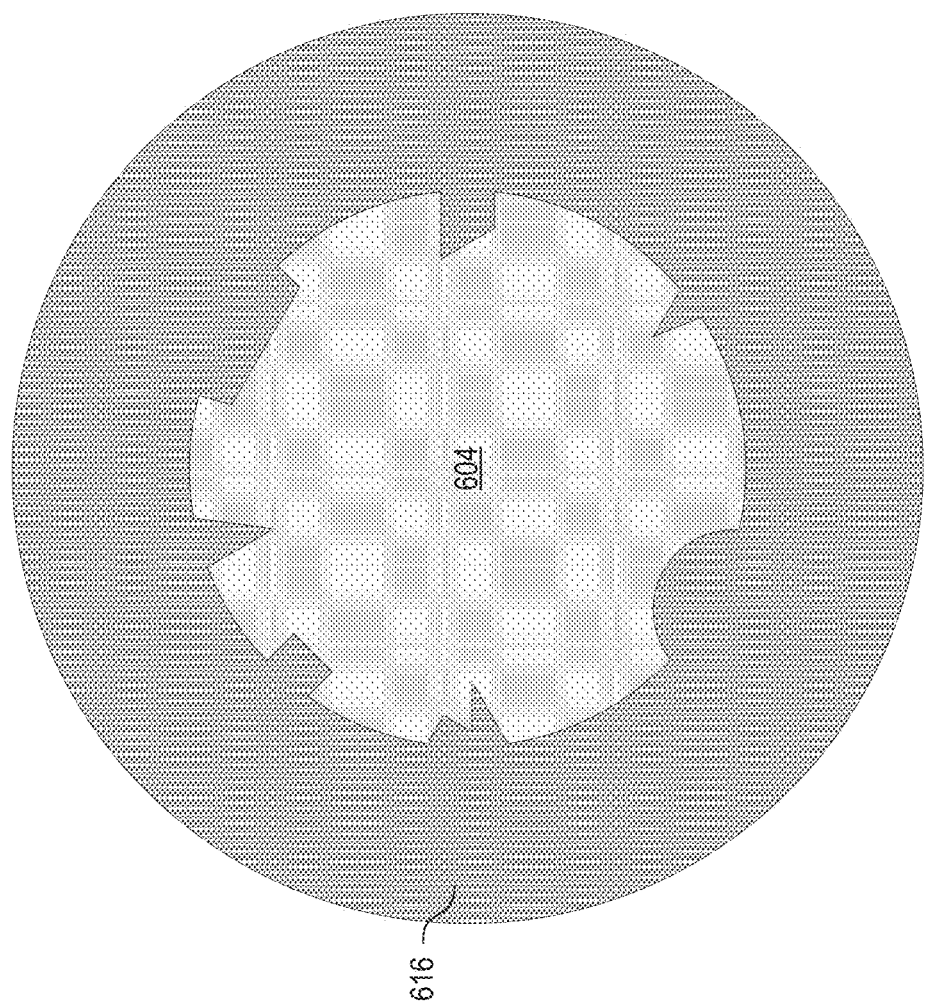
FIG. 6G
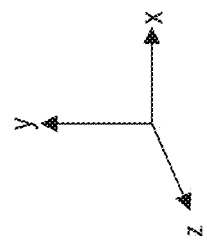

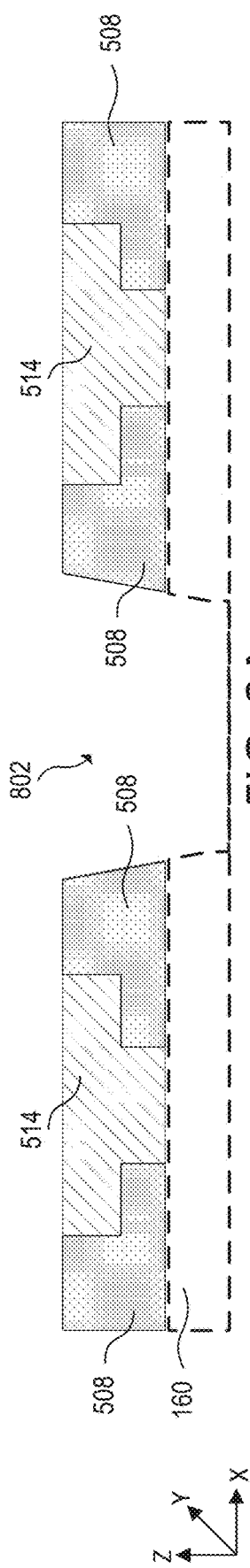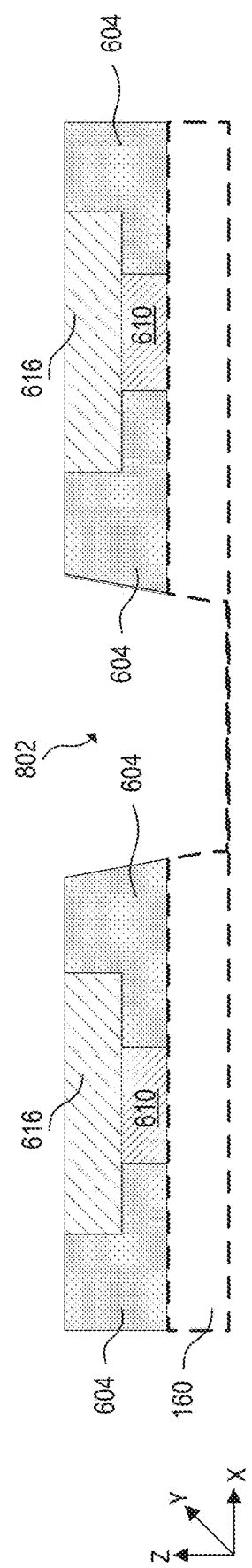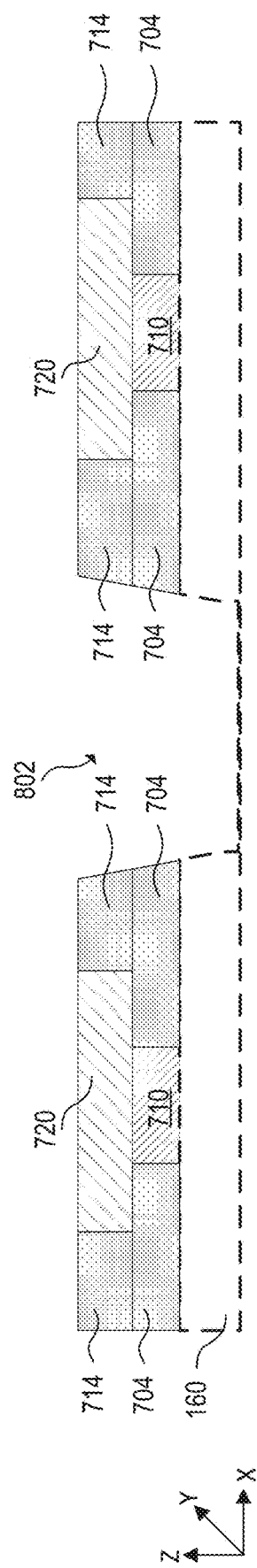

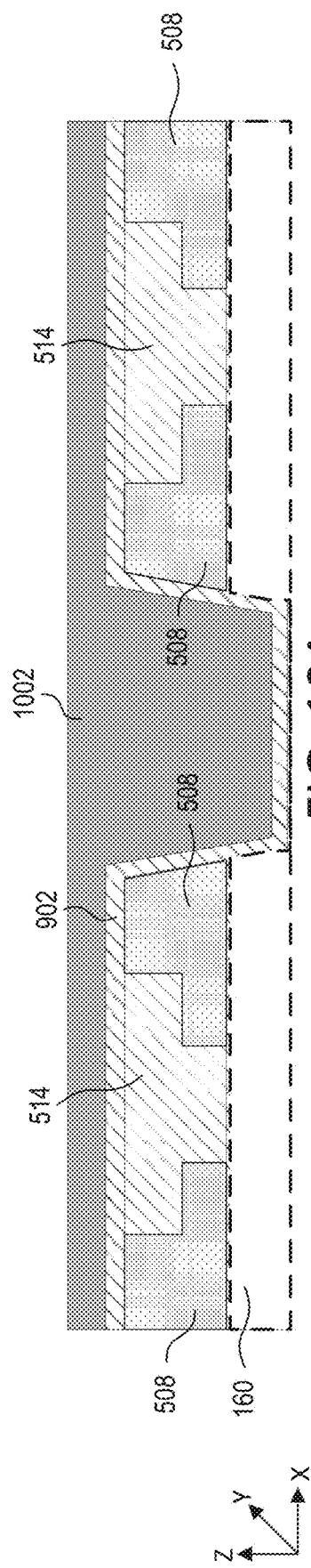
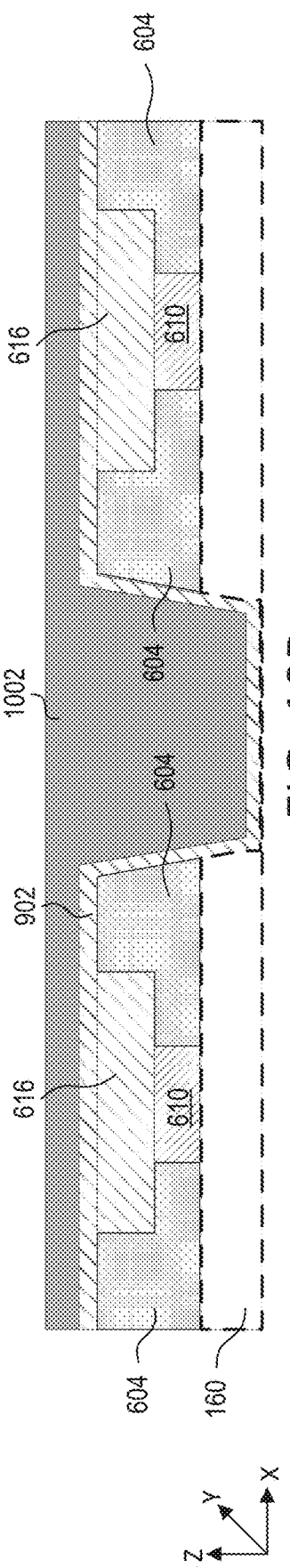
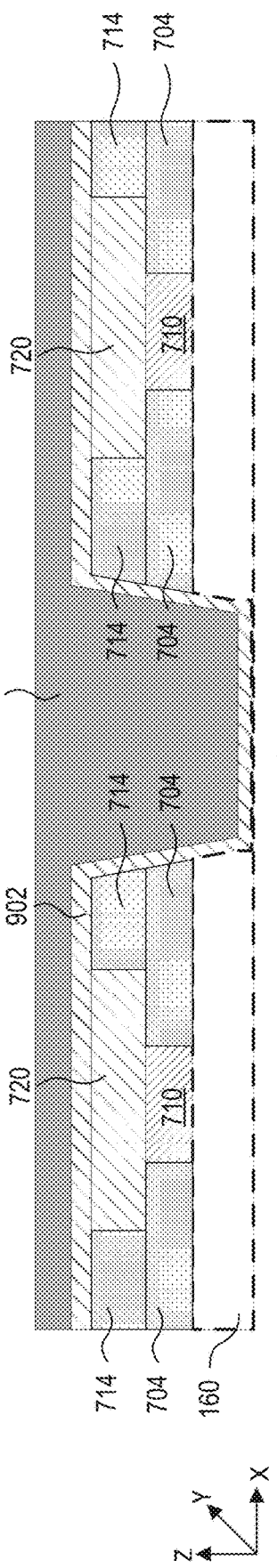

GROUNDED METAL RING STRUCTURE FOR THROUGH-SILICON VIA

CROSS-REFERENCE TO RELATED APPLICATION

This application claims the benefit of U.S. Provisional Patent Application No. 63/172,420, filed on Apr. 8, 2021 and titled "Grounded Through-Silicon Via Metal Ring Structure," the disclosure of which is incorporated by reference herein in its entirety.

BACKGROUND

Through-silicon vias (TSVs) are vias that extend from interconnect layers into a substrate. TSVs are formed with plasma-based processes such as etching and film deposition. Charges generated during the formation of the TSVs can be released to nearby circuits. The charging effect can destroy nearby circuits and cause problems such as leakage, burn-out, or plasma-induced damage (PID). The interconnect layers can include a dielectric material, such as an extremely low-k (ELK) dielectric material. Moisture and stress can also penetrate the ELK dielectric material from the TSVs and destroy the nearby circuits.

BRIEF DESCRIPTION OF THE DRAWINGS

Aspects of the present disclosure are best understood from the following detailed description when read with the accompanying figures.

FIGS. 2A and 2B illustrate isometric views of grounded metal ring structures, in accordance with some embodiments.

FIGS. 3A and 3B illustrate various views of a portion of a grounded metal ring structure, in accordance with some embodiments.

FIGS. 5A-5D are cross-sectional views of various stages of a fabrication process for forming grounded metal ring structures, in accordance with some embodiments.

FIG. 5E is a top view of a portion of a grounded metal ring structure, in accordance with some embodiments.

FIGS. 6A-6F are cross-sectional views of various stages of another fabrication process for forming grounded metal ring structures, in accordance with some embodiments.

FIG. 6G is a top view of a portion of a grounded metal ring structure, in accordance with some embodiments.

FIGS. 8A-8C, 9A-9C, 10A-10C, and 11A-11C are cross-sectional views of various stages of a fabrication process for forming TSVs, in accordance with some embodiments.

DETAILED DESCRIPTION

Figure 1A:
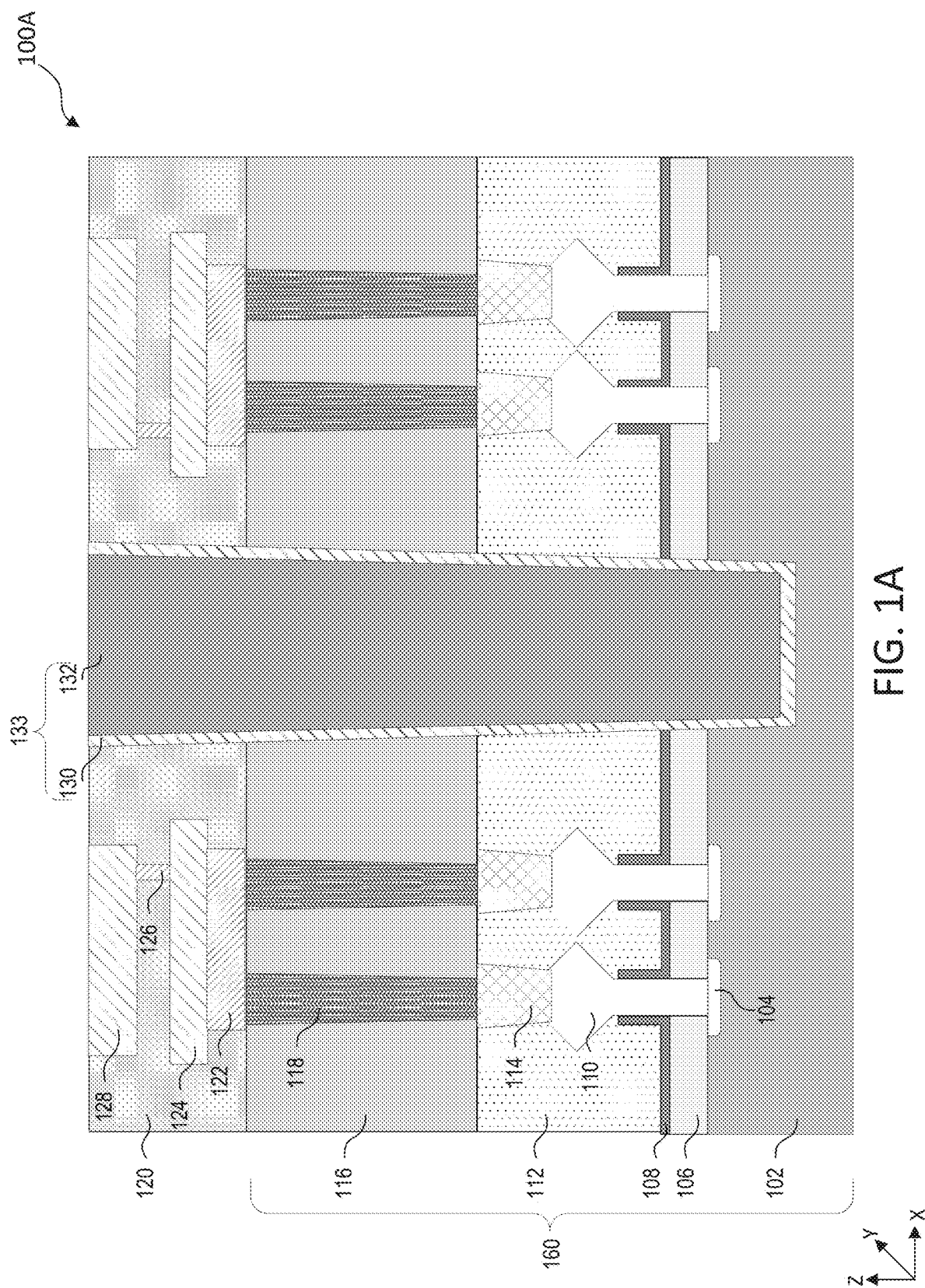
FIGS. 1A and 1B illustrate cross-sectional views of grounded metal ring structures for through-silicon vias (TSVs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The discussion of elements in FIGS. 1A-1B, 2A-2B, 3A-3B, 5A-5E, 6A-6G, 7A-7H, 8A-8C, 9A-9C, 10A-10C, and 11A-11C with the same annotations applies to each other, unless mentioned otherwise.

Through-silicon vias (TSVs) can be vias that extend from back-end-of-line (BEOL) layers, such as interconnect layers, into a substrate (e.g., a silicon (Si) substrate). TSVs are formed with plasma-based processes such as etching and film deposition. Charges generated during the formation of the TSVs can be released to nearby circuits. The charging effect can destroy the nearby circuits, and cause problems such as leakage, burn-out, or plasma-induced damage (PID). The interconnect layers can include a dielectric material, such as an extremely low-k (ELK) dielectric material (e.g., material having a dielectric constant of about 2.5 or less). Moisture and stress can also penetrate the ELK dielectric material from the TSVs and destroy the nearby circuits. One way to prevent the moisture and stress from propagating into the nearby circuits is to form metal ring structures around the TSVs. Metal ring structures can be formed by stacking metal rings formed in interconnect layers. The metal ring structures can contain moisture and stress from propagating which in turn protect nearby circuits and devices. Floating metal ring structures can absorb and accumulate charges during the plasma-based processes to form the TSVs. Charges also accumulate during the process of forming the metal ring structures. Once floating metal ring structures are saturated with charges, however, the charges can be released to the nearby circuits and destroy the ELK/oxide films and circuits. The charging effect can also complicate the fabrication process and make the fabrication process more unstable.

The present disclosure is directed to grounded metal ring structures for TSVs and methods for forming such structures. The metal ring structures can be formed by first etching a ring-shaped opening in a dielectric layer, and then depositing a conductive material in the ring-shaped opening. In some embodiments, the metal ring structures can include a stack of metal rings. In some embodiments, the metal ring structures can include metal vias between two adjacent metal rings. The metal via can be formed by filling a circular opening with a conductive material. In some embodiments, connecting metal vias can use a same conductive material as the adjacent metal rings. In some embodiments, metal vias and metal rings can be formed using different conductive materials. The formation of metal rings and metal vias can be repeated such that multiple layers of metal ring structures can be formed. The multiple layers of metal ring structures can be aligned to their outer surfaces, aligned to their inner surfaces, or not aligned at either the outer surfaces or the inner surfaces. The metal ring structures can be designed on the layout level such that the metal ring structures are connected to ground (e.g., an electrical ground potential) through conductive structures on different layout levels. By way of example and not limitation, conductive structures can be metal lines, interconnects, vias, metal contacts, source/drain (S/D) regions, metal gates and gate contacts, epitaxial semiconductor structures, doped semiconductor structures, etc. Because grounding of the metal ring structures can be performed through existing conductive structures and on the layout level, no additional manufacturing time or additional fabrication steps may be needed. Since the metal ring structures are grounded, the metal ring structures can efficiently release charges accumulated in the plasma-based processes such as etching and film deposition. The metal ring structures can also release charges generated during the formation of metal ring structures themselves because they are connected to ground during the fabrication processes. TSV can be used to transmit electrical current during normal operation of the circuitry and semiconductor devices. The electrical current can release charges into surrounding dielectric material and/or generate charges in the dielectric material. The metal ring structures can absorb these charges generated by the TSV during operation and release the charges into a ground electrical potential. With no accumulated charges in the metal ring structures, the circuits near the TSVs are protected and damages to the circuits from the charging effect are reduced. The fabrication process can also be more stable without the accumulated charges.

Based on the need to reduce charges, the size and number of layers (e.g., between about 1 and about 10 layers) of the grounded metal ring structures can vary. The grounded metal ring structures can have smooth inner surfaces. The grounded metal ring structures can have rough or non-smooth inner surfaces. By way of example and not limitation, the non-smooth inner surfaces of the grounded metal ring structures can include wrinkles, such as indented lines or patterns on the inner surfaces. The non-smooth inner surfaces of the grounded metal ring structures can include tips, such as protrusions in triangular, rectangular, semi-circular, trapezoidal, or any other suitable shapes. The non-smooth inner surfaces of the grounded metal ring structures can be more attractive to charges than smooth inner surfaces and optimize charge-absorbing efficiency.

Figure 1B:
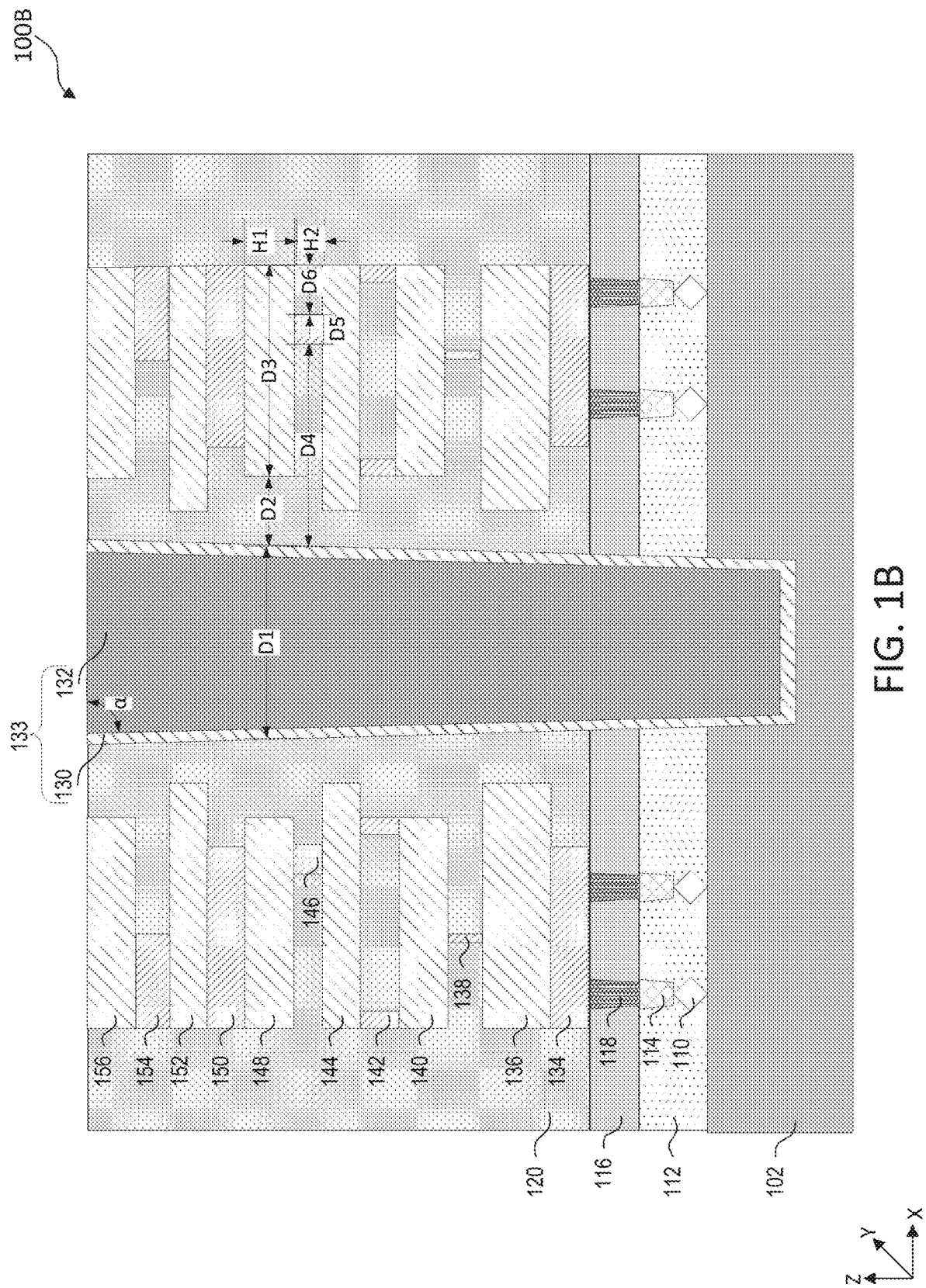

According to some embodiments, FIGS. 1A and 1B illustrate cross-sectional views of grounded metal ring structures for TSVs. A TSV 133 can extend from a dielectric layer 120, through interlayer dielectric (ILD) 116 and ILD 112, to a substrate 102. Sidewalls of TSV 133 can be substantially perpendicular or can be slanted. For example, referring to FIG. 1B, angle α between a sidewall of TSV 133 and a top surface of TSV 133 can be between about 80° and about 90°. Grounded metal ring structures can be formed within dielectric layer 120. In some embodiments, interconnects can be formed within dielectric layer 120 and each metal ring of the grounded metal ring structures can be formed at a same level as an interconnect within dielectric layer 120. Metal lines, interconnects, and metal vias 118 can be formed within ILD 116. Transistor structures such as metal contacts 114, epitaxial structures 110 (e.g., source/drain (S/D) regions), liner layer 108, and shallow trench isolation (STI) 106 can be formed within ILD 112. Substrate 102 can include doped regions 104. Substrate 102 can be electrically coupled to an electrical ground potential. The grounded metal ring structures can be electrically coupled to substrate 102 via conductive structures such as metal vias 118, metal contacts 114, epitaxial structures 110, and doped regions 104. FIGS. 2A and 2B illustrate isometric views of grounded metal ring structures, FIG. 3A illustrates a top view of a grounded metal ring structure, and FIG. 3B illustrates an isometric view of a portion of a grounded metal ring structure, according to some embodiments.

Referring to FIGS. 1A and 1B, substrate 102 can be a bulk semiconductor wafer or a top layer of a semiconductor on insulator (SOI) wafer. Further, substrate 102 can be made of Si or another elementary semiconductor, such as (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, substrate 102 can be formed of crystalline materials. In some embodiments, an epitaxial layer, such as epitaxial Si, can be epitaxially grown on substrate 102. Substrate 102 can be intrinsic (e.g., un-doped) or doped.

Referring to FIG. 1A, a top portion of substrate 102 can be doped by implanting appropriate dopants to form doped regions 104. Doped regions 104 can be doped with p-type dopants or n-type dopants. To form p-type dope regions 104, dopants such as boron (B) can be implanted at a concentration between about $5 \times 10^{16}$ atoms/cm$^3$ and about $1 \times 10^{19}$ atoms/cm$^3$ by an ion implanter. To form n-type doped regions 104, dopants such as arsenic (As), antimony (Sb), or phosphorous (P) can be implanted at concentrations between about $5 \times 10^{16}$ atoms/cm$^3$ and about $1 \times 10^{19}$ atoms/cm$^3$ by an ion implanter. The aforementioned dopant species can be implanted at a depth that ranges between about 100 nm and about 500 nm. In some embodiments, formation of doped regions 104 further includes an activation anneal after the ion implantation to ensure that the dopants are activated within the semiconductor lattice. In some embodiments, substrate 102 can be coupled to an electrical ground potential and doped regions 104 can form a part of a conductive path for releasing charges from the metal ring structures.

There can be fin structures in some regions of substrate 102, and the fin structures can be formed by epitaxially growing an epitaxial layer and patterning the epitaxial layer using suitable photolithography processes. STI 106 can be an insulating material and disposed on substrate 102 between each fin structure to provide insulation between adjacent fin structures. In some embodiments, nanostructures (e.g., nanosheets or nanowires) can be formed on substrate 102. Gate structures and gate spacers (not shown in FIG. 1A) can be disposed on the fin structures or nanostructures to form fin field-effect transistors (finFETs) or gate-all-around (GAA) structures, respectively. Epitaxial regions such as epitaxial structures 110 can be epitaxially grown from doped regions 104. Liner layer 108 can be disposed on STI 106, the gate structures, the gate spacers, and epitaxial structures 110. In some embodiments, liner layer 108 can be an etch stop layer (ESL), such as silicon nitride (SiN).

Referring to FIGS. 1A and 1B, epitaxial structures 110 can be an epitaxial material, such as Si or SiGe. Doped region 104 can function as a seed layer for the growth of epitaxial structures 110. In some embodiments, epitaxial structures 110 can be the S/D epitaxial regions in finFETs. Epitaxial structures 110 can be grown to a thickness between about 300 Å and about 1000 Å using a chemical vapor deposition (CVD) process. Source gases that can be used in the growth of epitaxial structures 110 include, but are not limited to, silane (SiH$_4$), silicon tetrachloride (SiCl$_4$), trichlorosilane (TCS), dichlorosilane (SiH$_2$Cl$_2$ or DSC), any suitable gases, and/or combinations thereof. In some embodiments, adjacent epitaxial structures 110 can be separate from each other, as shown in FIGS. 1A and 1B. In some embodiments, two adjacent epitaxial structures 110 can merge and form a combined flat or non-flat top surface (not shown in FIGS. 1A and 1B for simplicity). In some embodiments, top surfaces of epitaxial structures 110 can be doped with n-type or p-type dopants. Further, epitaxial structures 110 can be doped with the same type or different types of dopants than the underlying doped regions 104 and with the same or different dopant concentrations. Epitaxial structures 110 can form a part of a conductive path for the grounded metal ring structures.

ILD 112 can be an insulating material deposited on liner layer 108. ILD 112 can include a dielectric material and formed of silicon oxide (SiO$_x$), spin-on-glass (SOG), SiN, silicon oxynitride (SiON), fluorinedoped silicate glass (FSG), a low-k dielectric material, and/or other suitable insulating material. ILD 112 can be deposited on liner layer 108 by suitable deposition methods, such as CVD or plasma-enhanced chemical vapor deposition (PECVD). Other fabrication techniques for ILD 112 are possible. In some embodiments, ILD 112 can be initially blanket deposited over liner layer 108 and subsequently planarized using a chemical mechanical planarization/polishing (CMP) process so that the top surface of ILD 112 is substantially planar.

Metal contacts 114 can be formed on epitaxial structures 110. Metal contacts 114 can form a part of a conductive path for the grounded metal ring structures. In some embodiments, metal contacts 114 can be metal S/D contacts. In forming metal contacts 114, a contact opening can be formed through ILD 112 using suitable etching processes, such as dry etching. The bottom of the contact opening can expose a top surface of epitaxial structures 110. In some embodiments, a barrier layer and a seed layer (not shown in FIGS. 1A and 1B for simplicity) can be formed in the contact opening first before a filler metal layer can be disposed in the contact opening to form metal contacts 114. Barrier layers can be used to prevent metal diffusion and the seed metal layers can be used to improve adhesion and metal filling quality. Metal contacts 114 can include a suitable conductive material such as, for example, tungsten (W), molybdenum (Mo), nickel (Ni), bismuth (Bi), scandium (Sc), titanium (Ti), copper (Cu), cobalt (Co), silver (Ag), aluminum (Al), titanium aluminum nitride (TiAlN), tantalum carbide (TaC), tantalum carbonitride (TaCN), tantalum silicon nitride (TaSiN), manganese (Mn), zirconium (Zr), titanium nitride (TiN), tantalum nitride (TaN), ruthenium (Ru), tungsten nitride (WN), titanium carbide (TiC), titanium aluminum carbide (TiAlC), tantalum aluminum carbide (TaAlC), metal alloys, and/or combinations thereof. Metal contacts 114 can be deposited in the contact opening by suitable deposition methods, such as sputtering, physical vapor deposition (PVD), CVD, PECVD, or metal-organic chemical vapor deposition (MOCVD). In some embodiments, metal contacts 114 can be disposed by electroplating. Other fabrication techniques for metal contacts 114 are possible.

Additional dielectric layers and structures can be formed on ILD 112. For example, ILD 116 can be formed on ILD 112 and metal interconnect lines such as metal vias 118 can be formed within ILD 116. ILD 116 can be a substantially the same material as ILD 112, such as SiO$_x$. ILD 116 can be disposed by, for example, CVD. Metal vias 118 can be a substantially the same material as metal contacts 114. An opening can be formed in ILD 116 by etching and the opening can be filled with a conductive material to form metal vias 118. The conductive material can be deposited by sputtering, PVD, electroplating, any suitable deposition process, and/or combinations thereof. There can be one or more layers of ILD 116 and metal vias 118 to form the interconnect structures. Metal vias 118 can form a part of a conductive path for the grounded metal ring structures. For simplicity purposes, substrate 102, doped regions 104, STI 106, liner layer 108, epitaxial structures 110, ILD 112, metal contacts 114, ILD 116, and metal vias 118 are collectively annotated as element 160.

Dielectric layer 120 can be formed on ILD 116. Grounded metal ring structures can be formed in dielectric layer 120. In some embodiments, dielectric layer 120 can include any suitable dielectric material. In some embodiments, dielectric layer 120 can include an ELK dielectric material or a low-k dielectric layer (e.g., material having a dielectric constant lower than about 3.9). Dielectric layer 120 can include ILDs or intermetal dielectrics (IMDs). In some embodiments, dielectric layer 120 can include $SiO_x$. Dielectric layer 120 can be disposed by any suitable deposition processes, such as a CVD process. In some embodiments, dielectric layer 120 can have a greater thickness than ILD 116 or 112.

Referring to FIG. 1A, in some embodiments, a grounded metal ring structure can include metal rings 122, 124, and 128, and metal vias 126 interposed between metal rings 124 and 128. Metal rings 122, 124, and 128 can be laterally surrounding TSV 133. The grounded metal ring structures can be formed by stacking metal rings or stacking metal rings and metal vias. For example, the grounded metal ring structures can include a stack of metal rings. In some embodiments, the grounded metal ring structures can include metal rings and metal vias interposed between metal rings. Openings can be formed in dielectric layer 120 and filled with conductive materials to formed metal rings and vias. Metal vias and metal rings can use a substantially the same conductive material as metal contacts 114 or metal vias 118. A barrier layer and/or a seed metal layer (not shown in FIG. 1A) can be deposited in the openings before a filler metal layer is disposed to form the metal vias and the metal rings. Each metal ring and each metal via can use the same conductive material or different conductive materials. The formation process of metal rings and metal vias can be repeated such that multiple layers of metal ring structures can be formed. The multiple layers of metal ring structures can be aligned to their outer surfaces, aligned to their inner surfaces, or misaligned (e.g., with horizontal offset) at either the outer surfaces or the inner surfaces. By way of example and not limitation, FIG. 1A shows adjacent grounded metal rings misaligned (e.g., not on a same vertical plane) at either the outer surfaces or the inner surfaces. The metal ring structures can be designed on the layout level such that the metal ring structures are connected to ground through conductive structures on different layout levels. For example, metal ring structures formed at different interconnect levels are electrically connected to each other and electrically coupled to a ground electrical potential. FIG. 1A shows that the metal ring structures 128, 126, 124, and 122 are electrically connected to substrate 102 through conductive structures such as metal vias 118, metal contacts 114, epitaxial structures 110, and doped regions 104. Substrate 102 can serve as an electrical ground to absorb charges collected by the above-mentioned metal ring structures and transferred through the conductive structures. Ion implantation can be used on conductive structures in the conductive path to reduce path resistance. Because the grounding can be performed through existing structures and performed on the layout level, no additional manufacturing time or fabrication steps are needed. In some embodiments, additional conductive structures can be formed between metal ring structures and substrate 102 to enhance conductivity. For example, metal vias 118 can be in direct contact with a bottom surface of the lowest metal ring and a top surface of doped regions 104 or substrate 102.

Referring to FIG. 1B, in some embodiments, a grounded metal ring structure can include metal rings 134, 136, 140, 144, 148, 150, 152, 154, and 156, and metal vias 138, 142, and 146. In some embodiments, one surface such as a top surface of metal ring 136 can be in contact with metal via 138, and another surface such as a bottom surface of metal ring 136 can be in contact with metal ring 134. In some embodiments, both surfaces of metal ring 154 can be in contact with metal rings 152 and 156. In some embodiments, both surfaces of metal ring 140 can be in contact with metal vias 138 and 142. In some embodiments, there can be one metal via 146 on one side of metal ring 144. In some embodiments, there can be multiple, such as two metal vias 142 on one side of metal ring 140. A grounded metal ring structure can have one of the above-described embodiments or any combination of the different embodiments. By way of example and not limitation, the grounded metal ring structure can be aligned to an outer surface, an inner surface, or both surfaces of metal rings. Some metal rings can be aligned to their outer or inner surfaces, and the others can be misaligned at their outer or inner surfaces. Some metal vias can be aligned or misaligned to an outer or inner surface of some metal rings. Alignment of the grounded metal ring structures can facilitate fabrication. Alignment or misalignment of the grounded metal ring structures may depend on other structures on the layout level. Based on the need to reduce charges, the number of layers of the grounded metal ring structures can vary. By way of example and not limitation, between about 1 and about 10 layers of grounded metal ring structures can be used. More layers of grounded metal ring structures can release charges more effectively and can have higher capacities for charges. In some embodiments, the number of layers can conform to the number of interconnect levels. In some embodiments, each of the grounded metal rings can be formed concentrically with each other, for example, the centers of each grounded metal ring can be aligned on the same vertical axis. In some embodiments, a selection of grounded metal rings of the metal ring structure can be formed "off axis" to accommodate the placement or dimensions of adjacent semiconductor devices/structures. For example, centers of a selection of grounded metal rings can be different from centers of the remaining selection of grounded metal rings.

Dimensions of the grounded metal ring structures can be varied based on the need to reduce charges. Diameter D1 of TSV 133 can be about several micrometers. Distance D2 between the grounded metal ring structures and the TSV can be between about 3 nm and about 150 nm, between about 5 nm and about 120 nm, between about 10 nm and about 100 nm. Ratio between D1 and D2 can be between about 10 and about 500. For example, the ratio can be between about 20 and about 400, between 30 and about 200, between 40 and about 100. A lower D2 or a greater D1/D2 ratio can provide benefits such as a metal ring being in a closer proximity to the TSV that in turn improves charge attraction. If D2 is lower than about 3 nm or D1/D2 ratio is greater than about 500, the metal ring may hinder the formation of the TSV due to lower fabrication yield. A greater D2 or a smaller D1/D2 ratio can provide benefits such as greater fabrication alignment tolerance and electrical short prevention between TSV 133 and the metal ring structures. In some embodiments, a greater D2 or a smaller D1/D2 ratio may lead to a reduction in charge attraction efficiency. For example, if D2 is greater than about 150 nm or D1/D2 ratio is smaller than about 10, charge attraction efficiency may not be sufficient. A greater D2 or a smaller D1/D2 ratio could also result in a large metal ring that may occupy significant device space. Width D3 of metal ring 148 can be between about 3 nm and about 1100 nm, between about 5 nm and about 1050 nm, between about 10 nm and about 1000 nm. Ratio between D1 and D3 can be between about 1 and about 500. For example, the ratio can be between about 2 and about 400, between 5 and about 200, between 10 and about 100. A greater D3 or a smaller D1/D3 ratio can provide benefits such as a larger metal ring size because D3 is the width of the metal ring. A larger metal ring can release charges more effectively and can have a higher capacity for charges. A lower D3 or a greater D1/D3 ratio can provide benefits such as a slimmer metal ring, which would save significant device space on the layout level. If D3 is lower than about 3 nm or D1/D3 ratio is greater than about 500, the metal ring may have too small a capacity to accumulate charges effectively. If D3 is greater than about 1100 nm or D1/D3 ratio is smaller than about 1, it would result in a large metal ring that may occupy significant device space on the layout level.

Distance D4 between the inner surface of metal ring 148 and metal via 146 can be between about 3 nm and about 950 nm, between about 5 nm and about 920 nm, between about 10 nm and about 900 nm. A greater D4 can provide benefits such as a greater number of metal vias 146 across metal ring 148 because the circumference on which metal vias are positioned would be greater. A greater number of metal vias can release charges across the metal ring more uniformly. A lower D4 can provide benefits such as a metal via being in a closer proximity to the TSV. A closer proximity of the metal via can improve charge attraction. If D4 is lower than about 3 nm, the metal via may reduce fabrication yield of TSVs and metal ring structures. If D4 is greater than 950 nm, the charge attraction may not be effective since the metal via would be far from the TSV. Width D5 of metal via 146 can be between about 3 nm and about 110 nm, between about 5 nm and about 105 nm, between about 10 nm to about 100 nm. A greater D5 can provide benefits such as a larger metal via size because D5 represents the width of the metal via. A larger metal via can release charges more effectively and can have a higher capacity for charges. A lower D5 can provide benefits such as a greater number of metal vias 146 across metal ring 148 due to the lower width of each metal via. A greater number of metal vias can release charges across the metal ring more uniformly. If D5 is lower than about 3 nm, the metal via may have too small a capacity to accumulate charges effectively. If D5 is greater than about 110 nm, it would result in a large metal via that may occupy significant device space on the layout level. The total number of metal vias would also reduce because each metal via would be bigger. Distance D6 between the outer surface of metal ring 148 and metal via 146 depends on D3, D4, and D5.

Height H1 of metal ring 148 can be between about 3 nm and about 1100 nm, between about 5 nm and about 1050 nm, between about 10 nm and about 1000 nm. A greater H1 can provide benefits such as a greater volume of the metal ring. A larger metal ring can release charges more effectively and can have a higher capacity for charges. A lower H1 can provide benefits such as a thinner metal ring, which would save significant device space on the layout level. If H1 is lower than about 3 nm, the metal ring may have too small a capacity to accumulate charges effectively. If H1 is greater than 1100 nm, it would result in a large metal ring that may occupy significant device space on the layout level. H1 may also be limited by the thickness of the layout level layer. Similar to H1 discussed above, height H2 of metal via 146 can be between about 3 nm and about 1100 nm, between about 5 nm and about 1050 nm, between about 10 nm and about 1000 nm. A greater H2 can provide benefits such as a larger metal via size because H2 is the height of the metal via. A larger metal via can release charges more effectively and can have a higher capacity for charges. A lower H2 can provide benefits such as a thinner metal via, which would save significant device space on the layout level. If H2 is lower than 3 nm, the metal via may have too small a capacity to accumulate charges effectively. If H2 is greater than 1100 nm, it would result in a large metal via that may occupy significant device space on the layout level. H2 may also be limited by the thickness of the layout level layer.

Referring to FIGS. 1A and 1B, in some embodiments, TSV 133 can be formed through different interlayer dielectrics. For example, TSV 133 can extend through dielectric layer 120, ILD 116, and ILD 112, into substrate 102. TSV 133 can be formed by etching an opening through dielectric layer 120, ILD 116, and ILD 112, and depositing a conductive material in the opening. In some embodiments, barrier layer 130 can be formed in the opening. Barrier layer 130 can include any suitable materials, such as a metal oxide ($MO_x$), a metal nitride ($MN_x$), a metal carbide ($MC_x$), a metalaluminate ($MAl_xO_y$), a combination of metal oxides ($M1O_x/M2O_x$), a metal-silicate ($MSiO_x$), or combinations thereof. In some embodiments, the metal in the above-mentioned materials is a transition metal, e.g., hafnium (Hf), Zr, Ti, or Al, a rare earth metal, e.g., yttrium (Y), ytterbium (Yb), or erbium (Er), or combinations thereof. By way of example and not limitation, barrier layer 130 can include zirconium oxide ($ZrO_x$). In some embodiments, barrier layer 130 can include zirconium-aluminum oxide (ZrAlO) with an Al concentration between about 10 atomic percent ("at. %") and about 25 at. %. In some embodiments, barrier layer 130 can include alternating layers of the aforementioned $ZrO_x$ and ZrAlO layers. In some embodiments, barrier layer 130 can include dielectric materials, such as SiN, silicon oxycarbonitride (SiOCN), silicon carbonitride (SiCN), other suitable insulating materials, or any combination thereof. In some embodiments, the thickness of barrier layer 130 can be about a few nanometers.

A conductive material can be deposited on barrier layer 130 to form TSV 133. The conductive material can use substantially the same conductive materials as those in metal contacts 114, metal vias 118, and the metal ring structures. A seed metal layer (not shown in FIGS. 1A and 1B) can be deposited on barrier layer 130 prior to the formation of TSV 133. The processes used to form TSV 133, such as plasma-enhanced dry etching and plasma-enhanced sputtering, can generate charges that are absorbed by the metal ring structures. The charges can accumulate in the metal ring structures over time if the metal ring structures are electrically floating (e.g., not connected to an electrical ground potential). Since the metal ring structures in this disclosure are electrically coupled to a ground potential, the metal ring structures can efficiently release the charges accumulated in the plasma-based TSV processes such as etching and film deposition. The metal ring structures can also release the charges generated during forming the metal ring structures themselves because they are connected to an electrical ground potential. With few to no accumulated charges in the metal ring structures, circuits and devices located adjacent to the TSVs are protected and damages to the circuits from the charging effect such as leakage, burn-out, or PID are reduced. The fabrication process can also be more stable without the accumulated charges. Non-smooth inner surfaces of the grounded metal ring structures can improve the absorption efficiency.

Referring to FIG. 2A, in some embodiments, grounded metal ring structures can include solely a stack of metal rings, such as metal rings 246 and 248. Metal rings 246 and 248 are misaligned at their outer surfaces and aligned at their inner surfaces. Metal ring 246 can have the same material as or different materials from metal ring 248. Metal rings 246 and 248 can be formed by filling ring-shaped openings with conductive materials.

Referring to FIG. 2B, in some embodiments, grounded metal ring structures include metal vias 252 formed on metal ring 250. Metal vias 252 are misaligned to both outer surface and inner surface of metal ring 250. Metal ring 250 can have the same material as or different materials from metal vias 252. Metal ring 250 can be formed by filling a ring-shaped opening with a conductive material. Metal vias 252 can be formed by filling circular openings with the same or a different conductive material. Metal ring 250 and metal vias 252 can be formed in a single etch-deposition process, and this process can be repeated to form multiple layers of grounded metal ring structures. For illustration purposes, FIG. 2B shows five metal vias 252. In some embodiments, different numbers of metal vias can be formed. For example, there can be more or fewer than five metal vias 252. For example, the number of metal vias can range from about 1 to about 20. Metal vias 252 can be arranged in a concentric circle or in other arrangements depending on other structures on the layout level. In some embodiments, metal ring structures described in the present disclosure can include a combination of alternating layers of metal rings and metal rings and metal vias. For example, a grounded metal ring structure can include the structure shown in FIG. 2A as a selection of layers and incorporate the structure shown in FIG. 2B as other layers.

Referring to FIG. 3A, in some embodiments, a grounded metal ring structure can have a non-smooth inner surface. The grounded metal ring structures can have smooth inner surfaces. As long as the metal ring structures are grounded, the accumulated charges can be released to ground. Additionally and/or alternatively, the grounded metal ring structures can have rough or non-smooth inner surfaces. By way of example and not limitation, metal ring 302 can have tips, such as protrusions 310 in triangular, rectangular, semi-circular, trapezoidal, etc. shapes on the inner surfaces into dielectric layer 120. Width L1 of each tip can be between about 3 nm and about 15 µm, between about 5 nm and about 12 µm, between about 10 nm and about 10 µm. A greater L1 can provide benefits such as a larger tip. A larger tip can attract charges more effectively. A lower L1 can provide benefits such as a greater number of tips because each tip would be smaller. If L1 is lower than about 3 nm, the tips may be too small to attract charges effectively, and it would be similar to smooth inner surfaces. If L1 is greater than about 15 µm, it would result in a small number of tips and also reduce the ability to attract charges effectively. Range and criticality of depth T1 of each tip can be similar to the range and criticality of width L1. Distance L2 between adjacent tips can be between about 3 nm and about 15 µm, between about 5 nm and about 12 µm, between about 10 nm and about 10 µm. A greater L2 can provide benefits such as providing more device space for a larger tip. A larger tip can attract charges more effectively. A lower L2 can provide benefits such as a greater number of tips because distance between each tip would be smaller. If L2 is lower than about 3 nm, the tips may be too crowded and the smaller sizes could lead to challenges during the fabrication process. If L2 is greater than about 15 µm, it would result in a small number of tips and reduce the ability to attract charges effectively. The total number of the tips in metal ring 302 depends on the size of metal ring 302, size L1 of each tip, and distance L2 between adjacent tips. When the size of the metal ring is determined, the smaller each tip is, and/or the smaller the distance between adjacent tips is, the greater number of the tips there is. When the size of each tip is determined, the bigger the metal ring is, the more tips there are, and the smaller the distance between adjacent tips is, the more tips there are as well. When the distance between adjacent tips is determined, the bigger the metal ring is, the more tips there are, and the smaller each tip is, the more tips there are as well. The tips can be formed on metal ring 302 by photolithographic patterning when the ring-shaped opening for metal ring 302 is formed. The tips can additionally and/or alternatively be formed by anisotropic etching when the ring-shaped opening for metal ring 302 is formed.

Referring to FIG. 3B, in some embodiments, metal ring 312 can have wrinkles 314, such as indented lines or patterns on the inner surfaces. Range and criticality of width L3 of each wrinkle 314 can be similar to the range and criticality of width L1. Range and criticality of distance L4 between adjacent wrinkles 314 can be similar to the range and criticality of distance L2. Depth T2 of each wrinkle 314 can be between about 3 nm and about 900 nm, between about 5 nm and about 850 nm, between about 10 nm and about 800 nm. A greater T2 can provide benefits such as a rougher surface. A rougher surface can attract charges more effectively. A lower T2 would be easier to fabricate. If T2 is lower than about 3 nm, the tips wrinkles may be too small to attract charges effectively, and it would be similar to smooth inner surfaces. Implementing T2 that is greater than about 900 nm can lead to challenges in the fabrication process. Wrinkles 314 can be formed by anisotropic etching and/or photolithographic patterning. The non-smooth inner surfaces of the grounded metal ring structures can optimize absorption efficiency of charges during the formation of TSVs. The non-smooth inner surfaces of the grounded metal ring structures can be more attractive to charges than smooth inner surfaces, and thus more efficient in collecting and releasing charges. Metal vias of the grounded metal ring structures can similarly have smooth inner surfaces, or non-smooth inner surfaces with tips and/or wrinkles. The tips and/or wrinkles of metal vias can be formed by photolithographic patterning and/or anisotropic etching when via trenches are formed.

Figure 4:
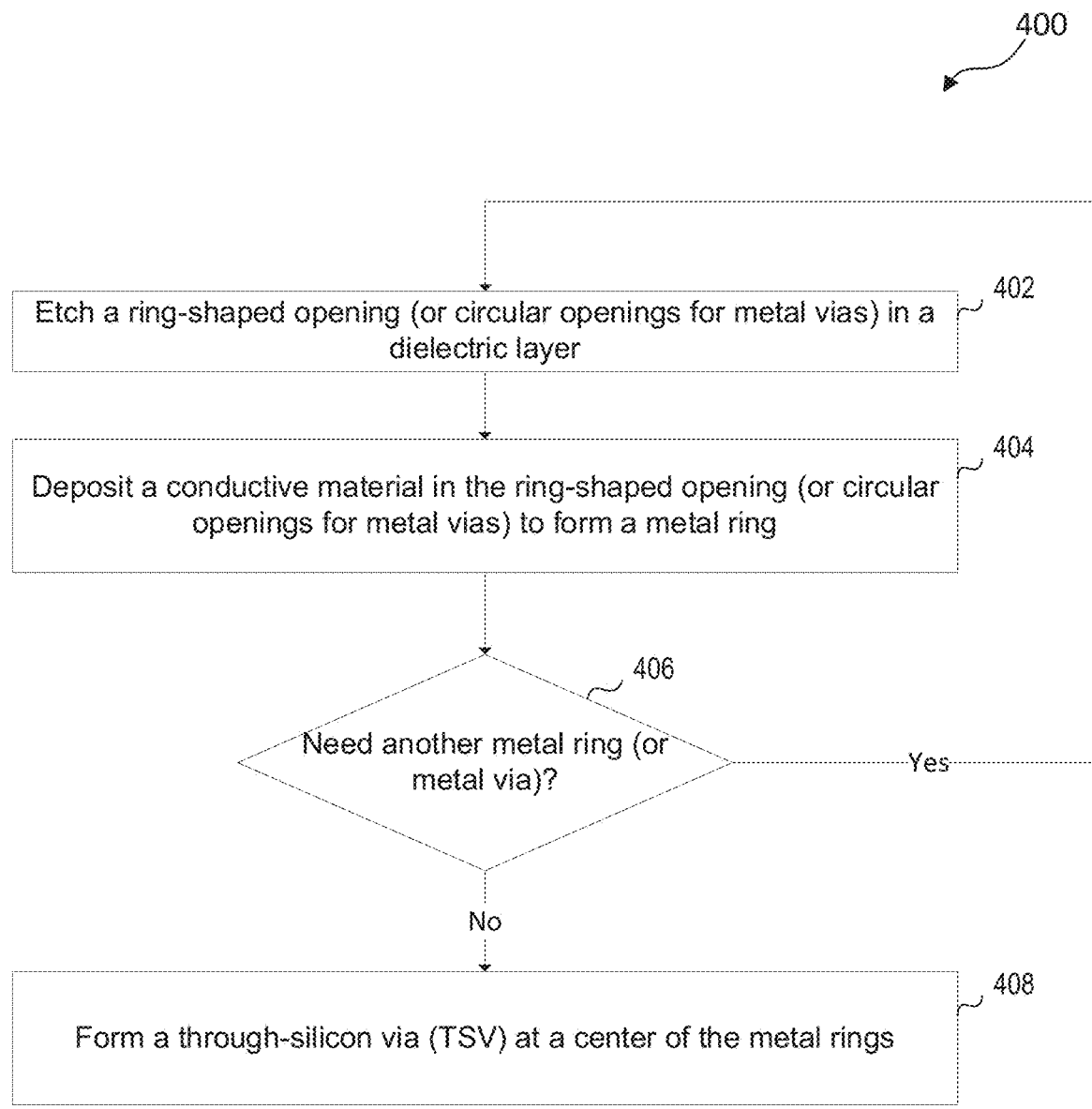
FIG. 4 is a flow diagram of a method for fabricating grounded metal ring structures, in accordance with some embodiments.
Figure 6D:
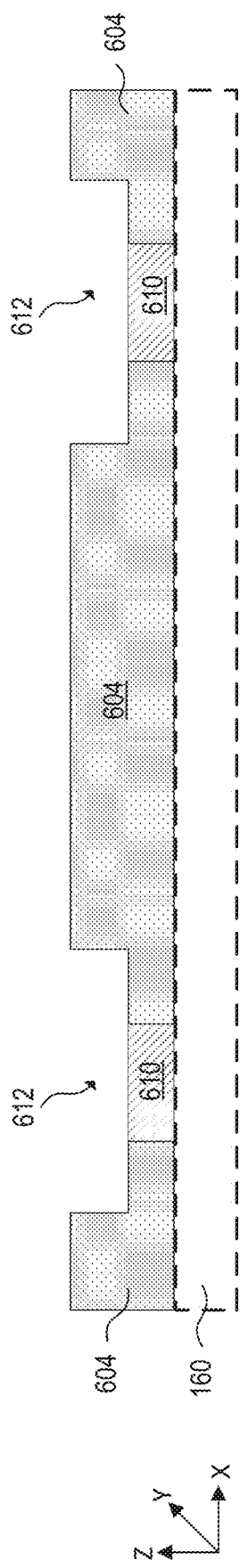
Figure 6E:
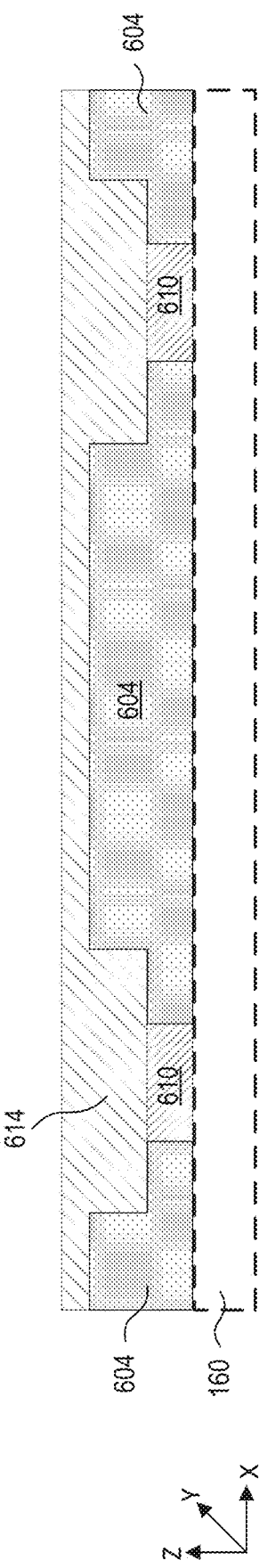
Figure 6F:
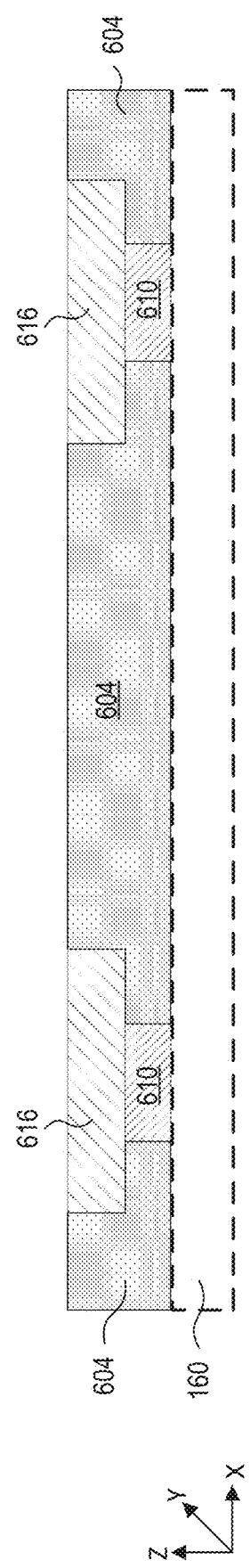

According to some embodiments, FIG. 4 is a flow diagram describing a method 400 for fabricating grounded metal ring structures 100A and 100B for TSVs, as shown in FIGS. 1A-1B, 2A-2B, and 3A-3B. For illustrative purposes, the operations illustrated in FIG. 4 will be described with reference to the example fabrication process for fabricating grounded metal ring structures 100A and 100B as illustrated in FIGS. 5A-5D, 6A-6F, 7A-7G, 8A-8C, 9A-9C, 10A-10C, and 11A-11C. Additional fabrication operations can be performed between the various operations of method 400 and can be omitted merely for clarity and ease of description. These additional fabrication operations are within the spirit and the scope of this disclosure. Moreover, not all operations can be required to perform the disclosure provided herein. Additionally, some of the operations can be performed simultaneously, or in a different order than the ones shown in FIG. 4. It should be noted that method 400 may not produce a complete metal ring structure 100A or 100B. Accordingly, it is understood that additional processes can be provided before, during, and after method 400, and that some other processes may only be briefly described herein. Elements in FIGS. 5A-5D, 6A-6F, 7A-7G, 8A-8C, 9A-9C, 10A-10C, and 11A-11C with the same annotations as elements in FIGS. 1A-1B are described above.

Figure 7A:
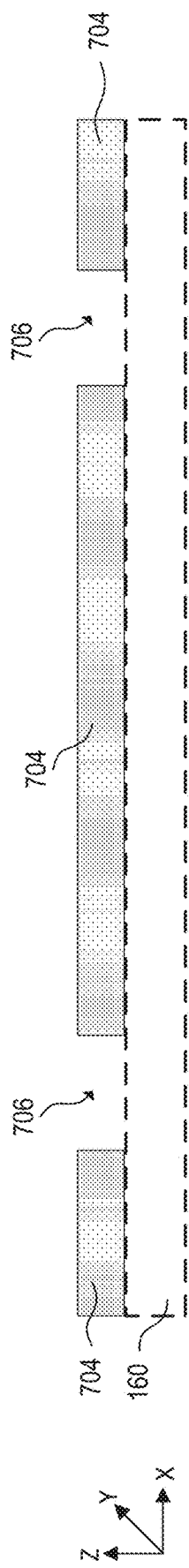
FIGS. 7A-7G are cross-sectional views of various stages of yet another fabrication process for forming grounded metal ring structures, in accordance with some embodiments.

Referring to FIG. 4, in operation 402, a ring-shaped opening is formed in a dielectric layer. For example, as shown in FIGS. 5A, 6A, and 7A, ring-shaped openings 506, 606, and 706 are formed in dielectric layers 508, 604, and

704. Dielectric layers 508, 604, and 704 can be an ELK dielectric material and can be deposited on element 160 using methods such as CVD. Ring-shaped openings 506, 606, and 706 can be formed by patterned photoresist (not shown in FIGS. 5A, 6A, and 7A). Photoresist layer can be patterned so that patterned photoresist structures are formed over dielectric layers 508, 604, and 704. Patterning of the photoresist layer can be accomplished by exposing the photoresist layer to ultraviolet (UV) or extreme ultraviolet (EUV) light through a reticle (e.g., a photomask) and subsequently removing unexposed (or exposed portions) of the photoresist layer. The pitch (e.g., spacing) of the patterned photoresist structures can vary depending on the pattern design. Therefore, high and low density areas of the patterned photoresist structures (e.g., patterned photoresist structures with different pitch or spacing) can be formed over different areas of dielectric layers 508, 604, and 704. Dielectric layers 508, 604, and 704 can be protected from the etching chemistries because the photoresist layer functions as an etch mask.

One or more etching processes can be used to remove dielectric layers 508, 604, and 704 between the patterned photoresist structures to form ring-shaped openings 506, 606, and 706. In other words, the patterned photoresist structures can be used as an etch mask to define the geometrical aspects of ring-shaped openings 506, 606, and 706. For example, the width and the pitch of the patterned photoresist structures can be used to further define the width and the pitch of the resulting ring-shaped openings 506, 606, and 706. In some embodiments, the sidewalls of the resulting ring-shaped openings 506, 606, and 706, can have a positive slope. However, this is not limiting, because ring-shaped openings 506, 606, and 706 can be designed to have substantially vertical sidewalls (e.g., between about 86° and about 900 with reference to the x-direction), or sidewalls with a negative slope. The corners between the sidewalls and the bottom of ring-shaped openings 506, 606, and 706 are shown to have a flat surface. In some embodiments, the corners can be rounded. The sidewall slope (or sidewall angle) of ring-shaped openings 506, 606, and 706 can be tuned by the dry etch process conditions. Therefore, the etching process conditions can be adjusted to achieve the desired slope for the sidewalls of ring-shaped openings 506, 606, and 706. In some embodiments, dry etching or wet chemical etching can be used. In some embodiments, the dry etch process can include several etch sub-steps with a different etch chemistry for each sub-step. After ring-shaped openings 506, 606, and 706 are formed, the patterned photoresist structures can be removed with a wet clean process (e.g., wet strip).

The dry etch process (e.g., reactive ion etching process) can use a gas mixture having fluorocarbon ($C_xF_y$), nitrogen, and argon. The gas mixture can have about 10% to about 70% $C_xF_y$. Ring-shaped openings 506, 606, and 706 can be formed by a wet etch process, according to some embodiments. The wet etch process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), or any combinations thereof. The etching process can be a selective etch or a timed etch such that the desired dimensions, e.g., width and height, of ring-shaped openings 506, 606, and 706 can be formed. The timing can be controlled such that the height of ring-shaped openings 506, 606, and 706 can be between about 10 nm and about 2000 nm.

Referring to FIG. 5B, in some embodiments, a multi-layer ring-shaped opening can be formed in dielectric layer 508. Based on ring-shaped opening 506, an additional timed dry etch and/or wet etch can be used to enlarge a top portion of ring-shaped opening 506 such that two-layer ring-shaped opening 510 can be formed. More etching steps can be used to form the multi-layer ring-shaped opening. The multi-layer ring-shaped opening can be filled with a conductive material to form a multi-layer metal ring.

Figure 7B:
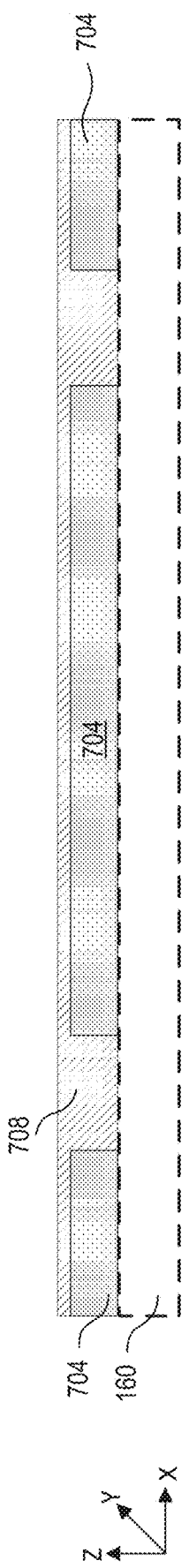

Referring to FIG. 4, in operation 404, a conductive material can be deposited in the ring-shaped opening to form a metal ring. For example, as shown in FIGS. 5C, 6B, and 7B, ring-shaped openings 510, 606, and 706 can be filled with filler metal 512, 608, and 708. Filler metal 512, 608, and 708 can include a suitable conductive material such as, for example, W, Mo, Ni, Bi, Sc, Ti, Cu, Co, Ag, Al, TiAlN, TaC, TaCN, TaSiN, Mn, Zr, TiN, TaN, Ru, WN, TiC, TiAlC, TaAlC, metal alloys, and/or combinations thereof. Filler metal 512, 608, and 708 can be deposited in ring-shaped openings 510, 606, and 706 by sputtering, PVD, CVD, PECVD, MOCVD, or electroplating. Other fabrication techniques for filler metal 512, 608, and 708 are possible. Referring to FIG. 5C, in some embodiments, one metal can be used to fill a bottom layer of two-layer ring-shaped opening 510, and a different the same metal can be used to fill a top layer of two-layer ring-shaped opening 510. Referring to FIGS. 5C, 6B, and 7B, in some embodiments, a barrier layer (not shown in FIGS. 5C, 6B, and 7B) can be formed in ring-shaped openings 510, 606, and 706 first before filler metal 512, 608, and 708 can be disposed in ring-shaped openings 510, 606, and 706. In some embodiments, a seed metal layer (not shown in FIGS. 5C, 6B, and 7B) can be disposed in ring-shaped openings 510, 606, and 706 first to improve adhesion and metal filling quality.

Figure 7C:
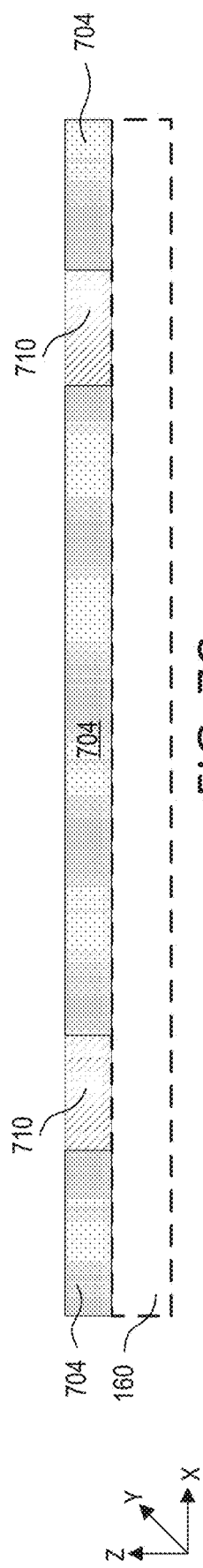
Figure 7D:
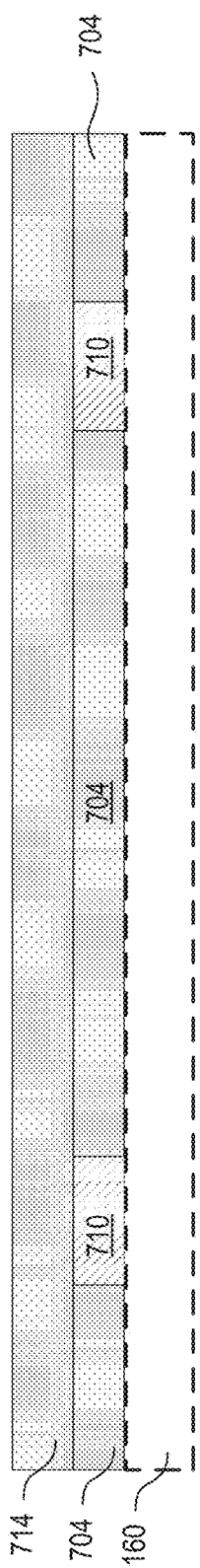
Figure 7E:
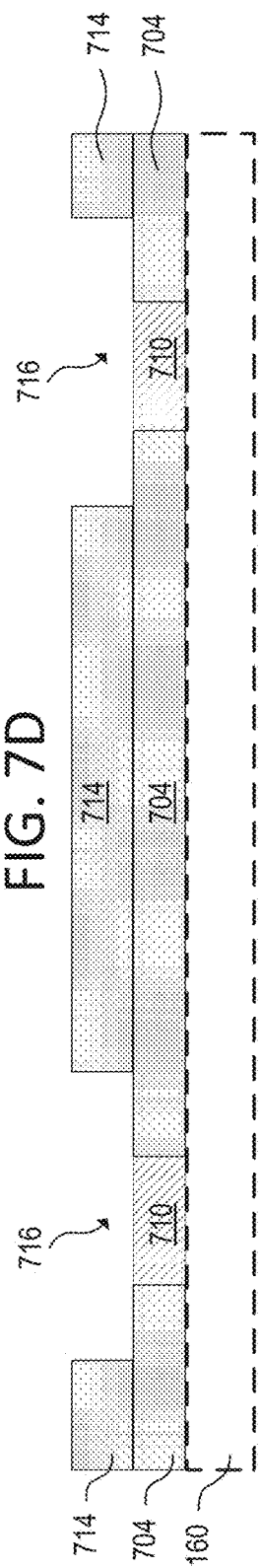
Figure 7F:
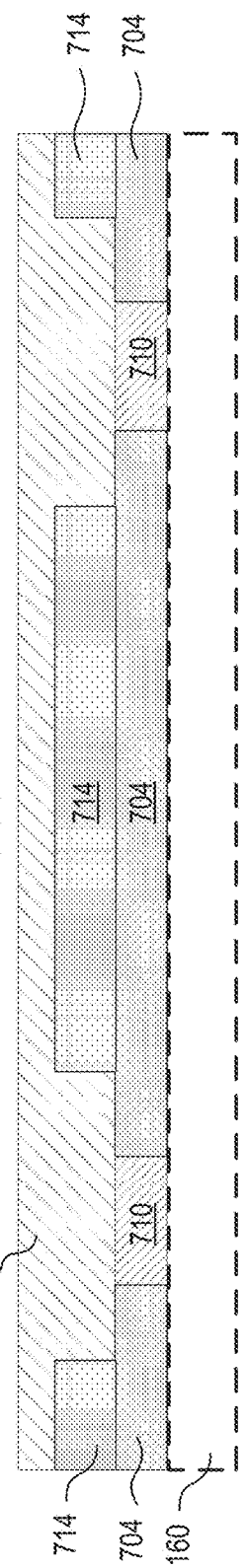
Figure 7G:
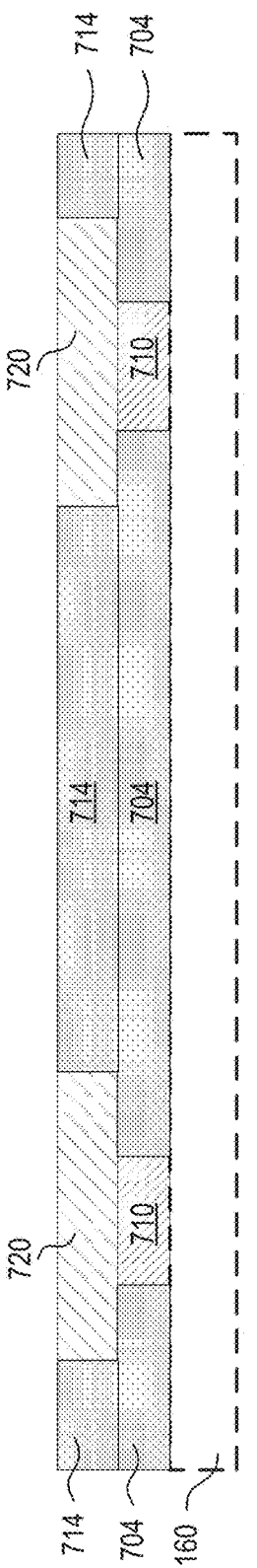

Referring to FIGS. 5D and 7C, in some embodiments, excessive filler metal 512 and 708 can be removed such that metal ring 514 and 710 is substantially co-planar (e.g., level) with dielectric layer 508 and 704. In some embodiments, after filler metal 512 and 708 is formed, a planarization process, such as CMP, is used to remove the extra thickness of filler metal 512 and 708 over dielectric layer 508 and 704. In various embodiments, other planarization/etching process can also be used to reduce the above-described layers to be substantially coplanar. By way of example and not limitation, the planarization process can remove about 20 nm from pre-CMP height of excessive filler metal 512 and 708.

Referring to FIG. 4, in operation 406, a decision can be made whether more layers of metal rings are needed. More layers of metal rings can have a higher capacity for absorbing electric charges. Therefore, more layers of metal rings can be needed for a TSV with a larger size. Plasma-based processes such as etching and deposition can generate more charges during formation of a larger TSV. More layers of metal rings can also be needed if there is a high density of TSVs in a layout area. More charges can be generated in an area with highly-densed TSVs during formation of the TSVs. If more layers of metal rings are needed, operations 402 and 404 can be repeated. For example, as shown in FIGS. 7D-7G, dielectric layer 714 can be deposited similarly as dielectric layer 704. An etch stop layer (not shown in FIG. 7D) can be disposed between dielectric layer 704 and dielectric layer 714. Ring-shaped opening 716 can be formed similarly as ring-shaped opening 706. Ring-shaped opening 716 can have a different size than ring-shaped opening 706. Filler metal 718 can be deposited in ring-shaped opening 716 and excessive filler metal 718 can be removed by CMP to form metal ring 720. Metal ring 720 can have the same conductive material as or different conductive material than metal ring 710.

Referring to FIGS. 6C-6F, in some embodiments, operations 402 and 404 need not be repeated entirely. Excessive filler metal 608 can be etched back using dry etch and/or wet etch such that metal ring 610 can be formed below a top surface of dielectric layer 604. A timed dry etch and/or wet etch can be used to form ring-shaped opening 612 above metal ring 610. Ring-shaped opening 612 can have a different size than ring-shaped opening 606. Filler metal 614 can be deposited in ring-shaped opening 612 and excessive filler metal 614 can be removed by CMP to form metal ring 616. Metal ring 616 can have the same conductive material as or different conductive material than metal ring 610.

Even though formation of metal rings is illustrated in FIGS. 5A-5D, 6A-6F, and 7A-7G, metal vias can be formed using substantially the same operations. For example, ring-shaped openings 506, 606, and 706 can be circular openings that can be filled with a conductive material to form metal vias 516, 610, and 710.

Figure 7H:
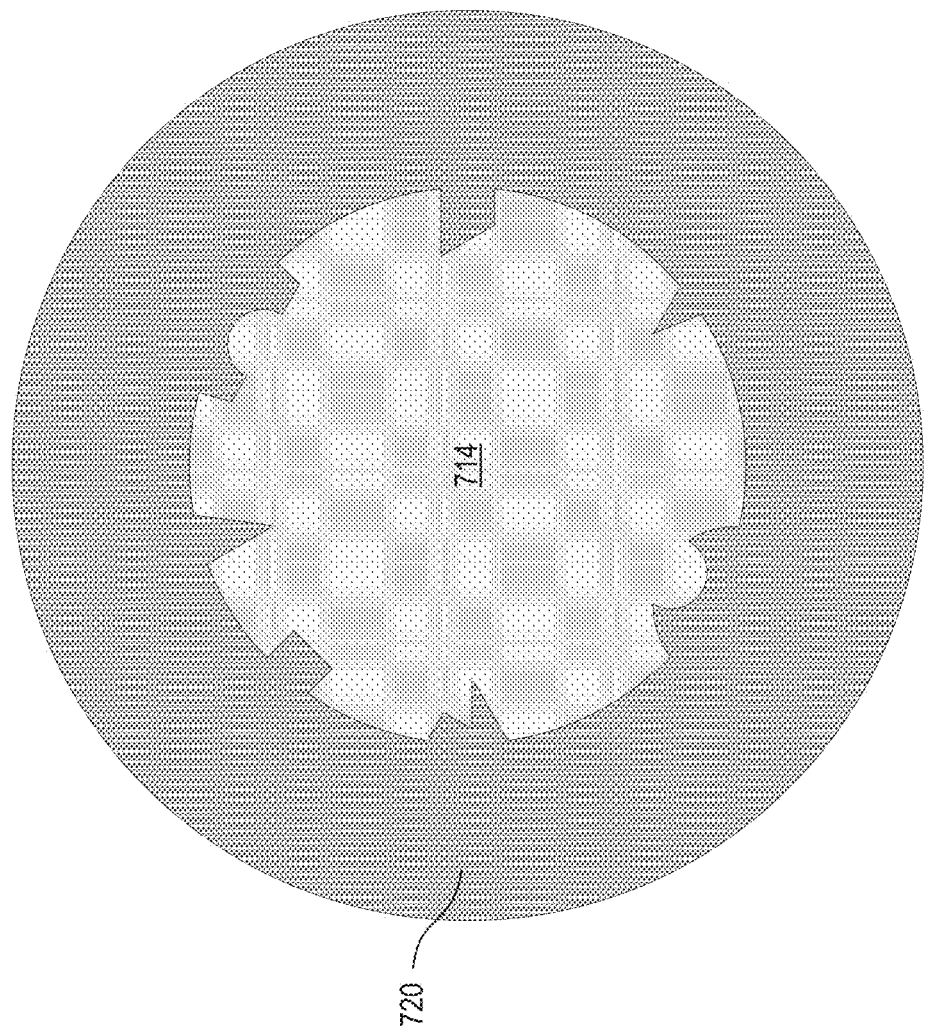
FIG. 7H is a top view of a portion of a grounded metal ring structure, in accordance with some embodiments.

Referring to FIGS. 5E, 6G, and 7H, in some embodiments, metal ring 514, 616, and 720 of the grounded metal ring structures can have rough or non-smooth inner surfaces. By way of example and not limitation, metal ring 514, 616, and 720 can have tips, such as protrusions in triangular, rectangular, semi-circular, trapezoidal, etc. shapes on the inner surfaces into dielectric layer 508, 604, and 714. The tips can be formed on metal ring 514, 616, and 720 by photolithographic patterning when ring-shaped openings 510, 612, and 716 are formed. The tips can additionally and/or alternatively be formed by anisotropic etching when ring-shaped openings 510, 612, and 716 are formed. Metal ring 514, 616, and 720 can additionally and/or alternatively have wrinkles, such as indented lines and/or patterns on the inner surfaces. The wrinkles can be formed by anisotropic etching and/or photolithographic patterning. The non-smooth inner surfaces of the grounded metal ring structures can optimize absorption efficiency of charges during the formation of TSVs. Plasma-based TSV processes such as etching and film deposition can generate charges. The non-smooth inner surfaces of the grounded metal ring structures can be more attractive to charges than smooth inner surfaces, and thus more efficient in collecting and releasing charges. Metal vias of the grounded metal ring structures can similarly have non-smooth inner surfaces with tips and/or wrinkles. The tips and/or wrinkles of metal vias can be formed by photolithographic patterning and/or anisotropic etching when circular opening 506, 606, and 706 are formed.

Referring to FIG. 4, if no more layers of metal rings are needed, in operation 408, a TSV can be formed at a center of the metal ring structure. For example, as shown in FIGS. 8A-11C, TSV 133 can be formed. In some embodiments, the TSV can be concentric with the metal ring structure. In some embodiments, the center of the TSV can be formed off the center of the metal ring structure. In some embodiments, the metal ring structure can be laterally surrounding the TSV. Referring to FIGS. 8A-8C, in some embodiments, TSV opening 802 can be formed through dielectric layer 508, 604, or 704 and element 160 into substrate 102 (not shown in FIGS. 8A-8C). Similarly to the process to form ring-shaped openings 506, 606, and 706, TSV opening 802 can be formed by patterned photoresist (not shown in FIGS. 8A-8C) and dry etching and/or wet etching. The etching conditions depend on the depth of TSV opening 802. The depth of TSV opening 802 depends on the distance from dielectric layer 508, 604, or 714 to substrate 102 (not shown in FIGS. 8A-8C) because TSV opening 802 extends through the dielectric layers and exposes portions of substrate 102 (not shown in FIGS. 8A-8C). If multiple interconnect layers are formed, the depth of TSV opening 802 can increase accordingly. Similarly, if multiple ILD layers are formed, the depth of TSV opening 802 can increase accordingly.

Figure 9A:
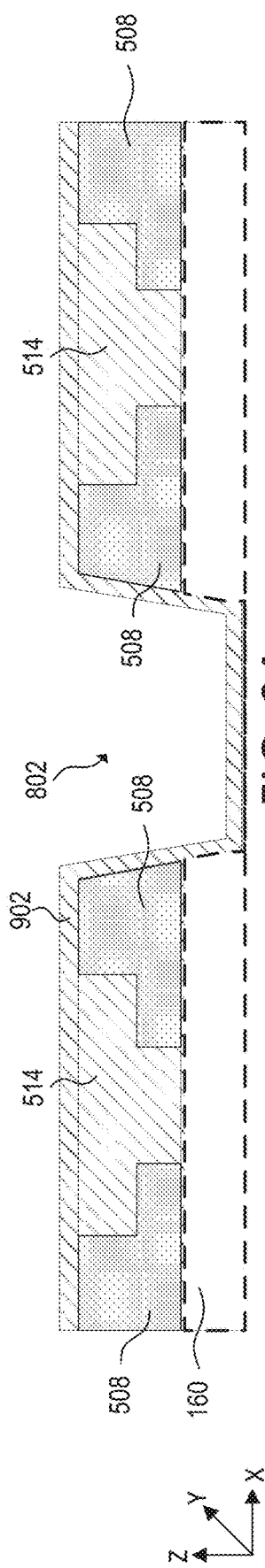
Figure 9B:
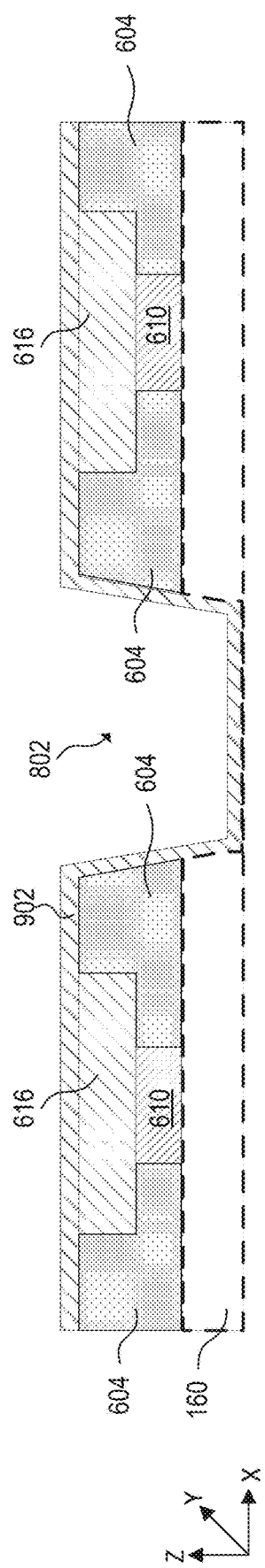
Figure 9C:
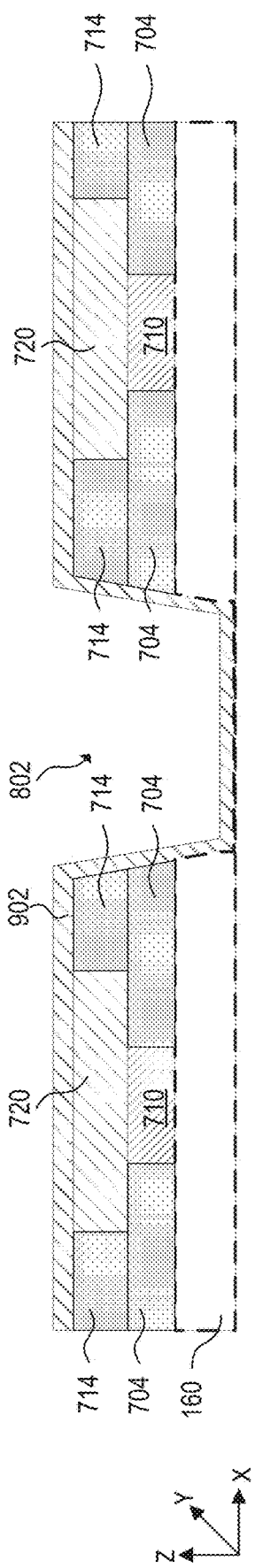

Referring to FIGS. 9A-9C, in some embodiments, barrier layer 902 can be deposited in TSV opening 802. In some embodiments, barrier layer 902 can be deposited by thermal or plasma atomic layer deposition (ALD) methods. Alternative deposition methods, such as PECVD and CVD, can be used.

Referring to FIGS. 10A-10C, in some embodiments, filler metal layer 1002 can be deposited in TSV opening 802. Filler metal layer 1002 can be deposited in TSV opening 802 by sputtering, PVD, CVD, PECVD, MOCVD, or electroplating. Other fabrication techniques for filler metal layer 1002 are possible. A seed metal layer (not shown in FIGS. 10A-10C) can be disposed in TSV opening 802, before filler metal layer 1002 is disposed. In some embodiments, filler metal layer 1002 can be formed using conductive materials similar to those formed in metal contacts 114, metal vias 118, and metal rings 514, 616, and 720.

Figure 11A:
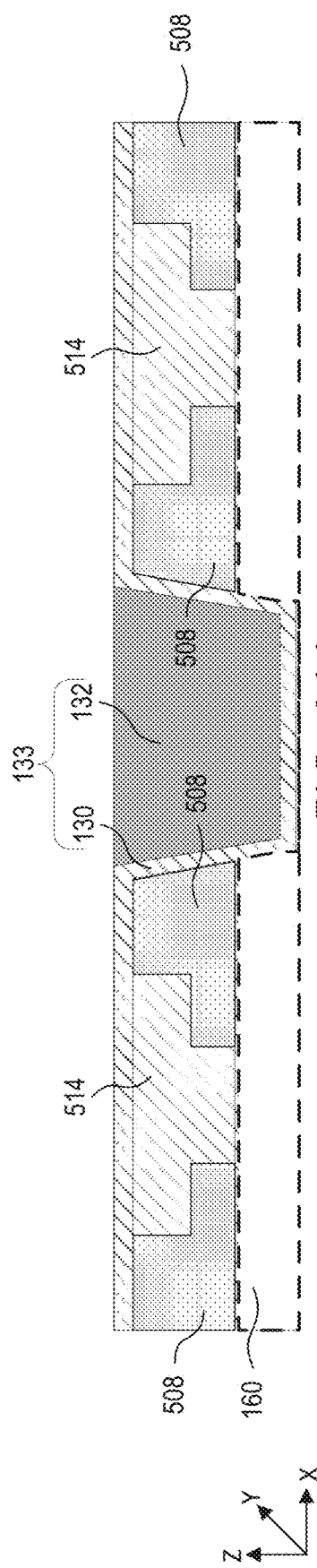
Figure 11B:
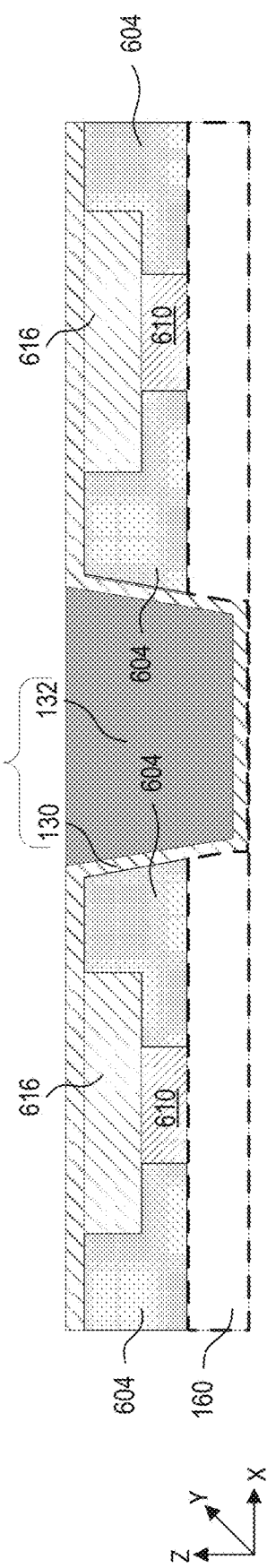
Figure 11C:
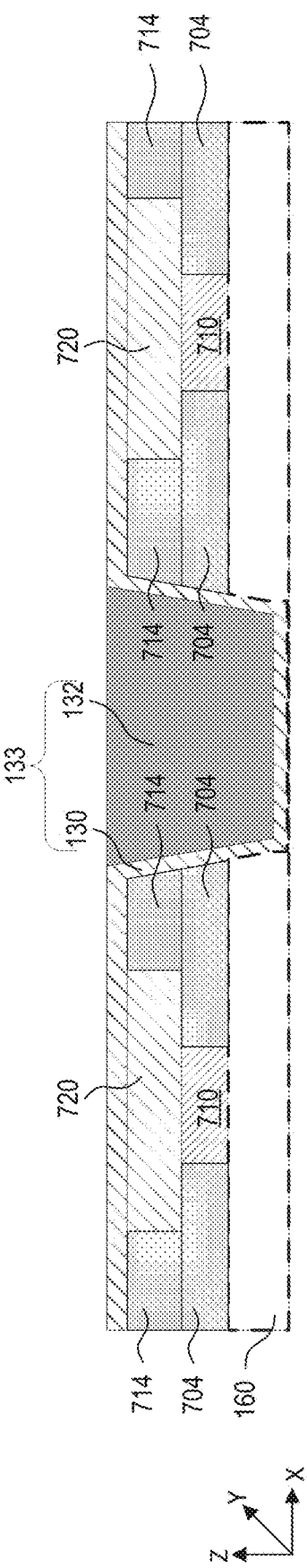

Referring to FIGS. 11A-11C, in some embodiments, excessive filler metal 1002 and barrier layer 902 can be polished such that filler metal 132 and barrier layer 130 can be substantially co-planar with the grounded metal ring structures, such as metal ring 514, 616, or 720. In some embodiments, after filler metal 1002 is formed, a planarization process, e.g., CMP, is used to remove the extra thickness of filler metal 1002 and barrier layer 902 over the grounded metal ring structures, such as metal ring 514, 616, or 720. In various embodiments, other planarization/etching process can also be used to reduce the above-described layers to be substantially coplanar. By way of example and not limitation, the planarization process can remove about 20 nm from pre-CMP height of filler metal 1002. During the plasma-enhanced etching and film deposition process of forming TSV 133, charges can accumulate in the metal ring structures. If the metal ring structures are floating, the metal ring structures can saturate after absorption of charges, and the charges can be leaked to nearby circuits and destroy the nearby circuits. Because the metal ring structures in the present disclosure are grounded, the accumulated charges can be released to ground as the charges are being absorbed. The non-smooth inner surfaces of the grounded metal ring structures can further improve the absorption efficiency.

The present disclosure is directed to grounded metal ring structures for TSVs and methods for forming such structures. The metal ring structures can be formed using a combination of metal rings and metal vias. Each metal ring and metal via can be filled with one or more conductive materials. The metal ring structures can be designed on the layout level such that the metal ring structures are connected to ground (e.g., an electrical ground potential) through conductive structures on different layout levels. Because the grounding is through existing structures and performed on the layout level, no additional manufacturing time or additional fabrication steps are needed. Since the metal ring structures are grounded, the metal ring structures efficiently release charges accumulated in the plasma-based processes such as etching and film deposition. The metal ring structures can also release charges generated during the formation of metal ring structures themselves because they are connected to ground during the fabrication processes. Non-smooth inner surfaces of the grounded metal ring structures can improve the absorption efficiency. With no accumulated charges in the metal ring structures, the circuits near the TSVs are protected and damages such as leakage, burn-out, or PID to the circuits from the charging effect are reduced.

In some embodiments, a semiconductor structure includes a TSV in contact with a substrate and a metal ring structure laterally surrounding the TSV. The metal ring structure includes one or more metal rings arranged as a stack and one or more metal vias interposed between two adjacent metal rings of the one or more metal rings. The metal ring structure is electrically coupled to the substrate through one or more conductive structures.

In some embodiments, a semiconductor structure includes a substrate, a dielectric layer formed on the substrate, and a plurality of interconnects formed in the dielectric layer. The semiconductor structure further includes a TSV formed in the dielectric layer and in contact with the substrate and one or more metal rings electrically coupled to each other and laterally surrounding the TSV. Each metal ring of the one or more metal rings is formed at a same level as an interconnect of the plurality of interconnects. A bottom metal ring of the one or more metal rings is in contact with a conductive structure, where the conductive structure is electrically coupled to the substrate.

In some embodiments, a method includes forming a transistor structure on a semiconductor substrate, where the semiconductor substrate is electrically coupled to an electrical ground potential. The method further includes forming an interconnect on the transistor structure, depositing a dielectric layer on the interconnect, and forming a metal ring structure. Forming the metal ring structure includes etching the dielectric layer to form a ring-shaped opening, where the opening exposes a portion of the interconnect, and depositing a conductive metal in the ring-shaped opening and on the exposed portion of the interconnect. The method further includes forming a TSV at a center of the metal ring structure, where the metal ring structure is configured to absorb electrical charges generated from the TSV and release the absorbed electrical charges to the electrical ground potential via the interconnect and the transistor structure.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the present disclosure.

What is claimed is:

1. A semiconductor structure, comprising:
   a substrate;
   a through-silicon via (TSV) in contact with the substrate; and
   a metal ring structure laterally surrounding the TSV, wherein the metal ring structure comprises:
     one or more metal rings arranged as a stack, wherein a metal ring of the one or more metal rings comprises a non-smooth inner surface; and
     one or more metal vias interposed between two adjacent metal rings of the one or more metal rings,
   wherein the metal ring structure is electrically coupled to the substrate through one or more conductive structures.

2. The semiconductor structure of claim 1, wherein the metal ring of the one or more metal rings comprises indented lines or patterns on the non-smooth inner surface of the metal ring.

3. The semiconductor structure of claim 1, wherein the metal ring of the one or more metal rings comprises protrusions on the non-smooth inner surface of the metal ring, and
   wherein the protrusions comprise triangular, rectangular, semi-circular, or trapezoidal shapes.

4. The semiconductor structure of claim 1, wherein the substrate is electrically coupled to an electrical ground potential.

5. The semiconductor structure of claim 1, wherein first and second metal rings of the one or more metal rings each comprises an inner surface that are misaligned with each other.

6. The semiconductor structure of claim 1, wherein the metal ring of the one or more metal rings is in contact with at least one metal via of the one or more metal vias.

7. The semiconductor structure of claim 1, wherein the metal ring of the one or more metal rings comprises a top surface and a bottom surface,
   wherein the top surface is in contact with an other metal ring of the one or more metal rings; and
   wherein the bottom surface is in contact with at least one metal via of the one or more metal vias.

8. The semiconductor structure of claim 1, wherein a first metal ring of the one or more metal rings comprises a top surface and a bottom surface, and
   wherein the top surface is in contact with a second metal ring of the one or more metal rings; and
   wherein the bottom surface is in contact with a third metal ring of the one or more metal rings.

9. The semiconductor structure of claim 1, wherein the one or more conductive structures comprise one or more of a contact, a source/drain (S/D), a gate, a gate contact, an epitaxial semiconductor structure, or a doped semiconductor structure.

10. The semiconductor structure of claim 1, wherein a metal via of the one or more metal vias comprises a non-smooth inner surface.

11. A semiconductor structure, comprising:
    a substrate;
    a dielectric layer disposed on the substrate;
    a plurality of interconnects disposed in the dielectric layer;
    a through-silicon via (TSV) disposed in the dielectric layer and in contact with the substrate; and
    one or more metal rings electrically coupled to each other and laterally surrounding the TSV, wherein:
      a metal ring of the one or more metal rings comprises a non-smooth inner surface and is disposed at a same level as an interconnect of the plurality of interconnects; and
      first and second metal rings of the one or more metal rings are in physical contact with each other.

12. The semiconductor structure of claim 11, wherein the metal ring of the one or more metal rings comprises indented lines or patterns on the non-smooth inner surface.

13. The semiconductor structure of claim 11, wherein the metal ring of the one or more metal rings comprises protrusions on the non-smooth inner surface of the metal ring, wherein the protrusions comprise triangular, rectangular, semi-circular, or trapezoidal shapes.

14. The semiconductor structure of claim 11, wherein the substrate is electrically coupled to an electrical ground potential.

15. The semiconductor structure of claim 11, wherein the first and second metal rings of the one or more metal rings each comprises an inner surface that are misaligned with each other.

16. The semiconductor structure of claim 11, further comprising a metal via with a non-smooth inner surface on to the first metal ring.

17. A semiconductor structure, comprising:
a substrate;
a dielectric layer disposed on the substrate;
a plurality of interconnects disposed in the dielectric layer;
a through-silicon via (TSV) disposed in the dielectric layer and in contact with the substrate; and
a metal ring structure laterally surrounding the TSV, wherein the metal ring structure comprises:
one or more metal rings arranged as a stack and laterally surrounding the TSV; and
one or more metal vias interposed between two adjacent metal rings of the one or more metal rings, wherein a metal via of the one or more metal vias comprises a non-smooth inner surface.

18. The semiconductor structure of claim 17, wherein the one or more metal rings and the one or more metal vias comprise different metals.

19. The semiconductor structure of claim 17, wherein the substrate is electrically coupled to an electrical ground potential.

20. The semiconductor structure of claim 17, wherein first and second metal rings of the one or more metal rings each comprises an inner surface that are misaligned with each other.

* * * * *

UNITED STATES PATENT AND TRADEMARK OFFICE
CERTIFICATE OF CORRECTION

PATENT NO. : 12,136,600 B2
APPLICATION NO. : 17/468886
DATED : November 5, 2024
INVENTOR(S) : Chen et al.

It is certified that error appears in the above-identified patent and that said Letters Patent is hereby corrected as shown below:

In the Specification

In Column 14, Line 23, after "and" delete "a different".

Signed and Sealed this
Tenth Day of December, 2024

Katherine Kelly Vidal
*Director of the United States Patent and Trademark Office*